(12) United States Patent
Kim

(10) Patent No.: US 11,600,710 B2
(45) Date of Patent: Mar. 7, 2023

(54) SEMICONDUCTOR DEVICE HAVING BURIED GATE STRUCTURE AND METHOD FOR FABRICATING THE SAME

(71) Applicant: SK hynix Inc., Gyeonggi-do (KR)

(72) Inventor: Dong-Soo Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/365,078

(22) Filed: Jul. 1, 2021

(65) Prior Publication Data

US 2021/0328033 A1 Oct. 21, 2021

Related U.S. Application Data

(63) Continuation of application No. 16/691,369, filed on Nov. 21, 2019, now Pat. No. 11,075,272.

(30) Foreign Application Priority Data

Jun. 17, 2019 (KR) .......................... 10-2019-0071525

(51) Int. Cl.
*H01L 29/423* (2006.01)
*H01L 29/78* (2006.01)
*H01L 29/49* (2006.01)
*H01L 27/108* (2006.01)
*H01L 29/51* (2006.01)

(52) U.S. Cl.
CPC ........ *H01L 29/4236* (2013.01); *H01L 27/108* (2013.01); *H01L 29/4916* (2013.01); *H01L 29/4966* (2013.01); *H01L 29/516* (2013.01); *H01L 29/7831* (2013.01); *H01L 29/7851* (2013.01)

(58) Field of Classification Search
CPC .......... H01L 29/4236; H01L 27/10823; H01L 29/42356; H01L 29/42364; H01L 29/42376; H01L 21/02172; H01L 21/02266; H01L 21/02315; H01L 21/324; H01L 21/76829; H01L 21/823462; H01L 27/10867; H01L 27/10873; H01L 27/10888; H01L 29/407; H01L 2924/01057
See application file for complete search history.

(56) References Cited

U.S. PATENT DOCUMENTS

2016/0315088 A1* 10/2016 Kang ................ H01L 29/66628
2019/0273152 A1* 9/2019 Yilmaz ............... H01L 29/1095
2020/0373392 A1* 11/2020 Hiyoshi ............. H01L 29/7813

* cited by examiner

*Primary Examiner* — Mohammed R Alam
(74) *Attorney, Agent, or Firm* — IP & T Group LLP

(57) ABSTRACT

Disclosed is a semiconductor device for improving a gate induced drain leakage and a method for fabricating the same, and the semiconductor device includes a substrate, a first doped region and a second doped region formed to be spaced apart from each other by a trench in the substrate, a first gate dielectric layer over the trench, a lower gate over the first gate dielectric layer, an upper gate over the lower gate and having a smaller width than the lower gate, and a second gate dielectric layer between the upper gate and the first gate dielectric layer.

18 Claims, 16 Drawing Sheets

SEMICONDUCTOR DEVICE HAVING BURIED GATE STRUCTURE AND METHOD FOR FABRICATING THE SAME

CROSS-REFERENCE TO RELATED APPLICATIONS

This application is a continuation of U.S. patent application Ser. No. 16/691,369 filed on Nov. 21, 2019, which claims benefits of priority of Korean Patent Application No. 10-2019-0071525 filed on Jun. 17, 2019. The disclosure of each of the foregoing application is incorporated herein by reference in its entirety.

BACKGROUND

1. Field

Exemplary embodiments relate to a semiconductor device, and particularly, to a semiconductor device having a buried gate structure and a method for fabricating the same.

2. Description of the Related Art

Typically, a metal gate electrode may be applied to a high-performance transistor. Particularly, a buried gate type transistor requires control of a threshold voltage for a high-performance operation. In addition, gate induced drain leakage (GIDL) characteristics greatly affect the performance of the buried gate type transistor.

SUMMARY

Exemplary embodiments of the present invention are directed to a semiconductor device including a novel transistor structure that reduces gate induced drain leakage (GIDL), and a method for fabricating the same.

In accordance with an embodiment of the present invention, a semiconductor device may include a substrate; a first doped region and a second doped region formed spaced apart from each other by a trench in the substrate; a first gate dielectric layer over the trench; a lower gate over the first gate dielectric layer; an upper gate over the lower gate and having a smaller width than the lower gate; and a second gate dielectric layer between the upper gate and the first gate dielectric layer.

In accordance with an embodiment of the present invention, a method for fabricating a semiconductor device may include forming a trench in a substrate; forming a first gate dielectric layer over the trench; forming a lower gate over the first gate dielectric layer; forming a second gate dielectric layer covering the first gate dielectric layer; and forming an upper gate over the second gate dielectric layer and the lower gate.

These and other features and advantages of the present invention will become apparent to those skilled in the art of the invention from the following detailed description in conjunction with the following drawings.

DETAILED DESCRIPTION

Figure 1:
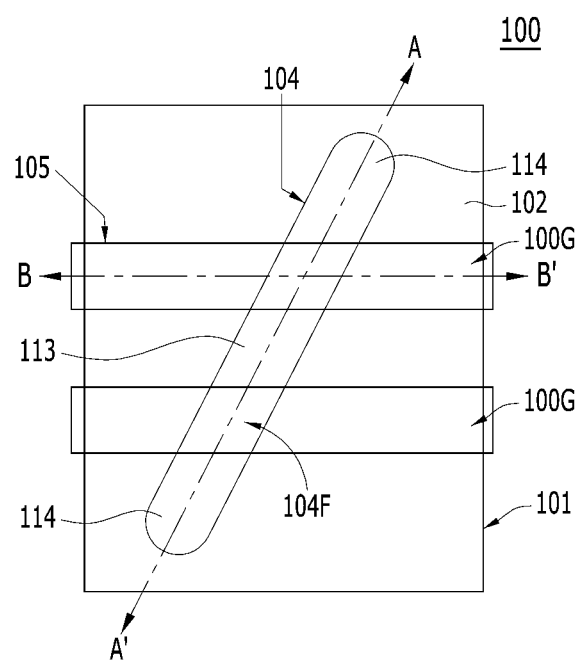
FIG. 1 is a plane view illustrating a semiconductor device in accordance with an embodiment of the present invention.

Exemplary embodiments described herein will be described with reference to cross-sectional views, plane views and block diagrams, which are ideal schematic views of the present invention. Thus, the structures of the drawings may be modified by fabricating techniques and/or tolerances. The embodiments of the present invention are not limited to the specific structures shown in the drawings, but include any changes in the structures that may be produced according to the fabricating process. Accordingly, the regions and the shapes of the regions illustrated in the drawings are intended to illustrate specific structures of regions of the elements, and are not intended to limit the scope of the invention.

Hereinafter, in the present embodiments, a threshold voltage Vt depends on a flat-band voltage VFB. The flat-band voltage VFB depends on a work function. The work function may be engineered by various methods. For example, the work function may be adjusted by a material of a gate electrode, a material between the gate electrode and a channel, and the like. By increasing or decreasing the work function, the flat-band voltage may be shifted. A high work function may shift the flat-band voltage in a positive direction, and a low work function may shift the flat-band voltage in a negative direction. As described above, the threshold voltage may be adjusted by shifting the flat-band voltage. In the embodiments, the threshold voltage may be adjusted by shifting the flat-band voltage even if the channel concentration is reduced or channel doping is omitted. In particular, the flat-band voltage may be lowered by a low work function material or dipole, thereby improving a gate induced drain leakage (GIDL).

Hereinafter, in the present embodiments, a buried gate structure may be located in a trench. The buried gate structure may include a gate dielectric layer and a gate electrode. The gate dielectric layer may cover the surface of the trench, and the gate electrode may partially fill the trench on the gate dielectric layer. Thus, the gate electrode may be referred to as a "buried gate electrode". The gate electrode may include a lower buried portion LB and an upper buried portion UB. The lower buried portion LB may fill the lower portion of the trench, and the upper buried portion UB may fill the upper portion of the trench on the lower buried portion LB. As such, the gate electrode may be a dual gate electrode having the upper buried portion UB located on the lower buried portion LB. The lower buried portion LB may overlap the channel, and the upper buried portion UB may overlap first and second doped regions, that is, source/drain regions.

Figure 2A:
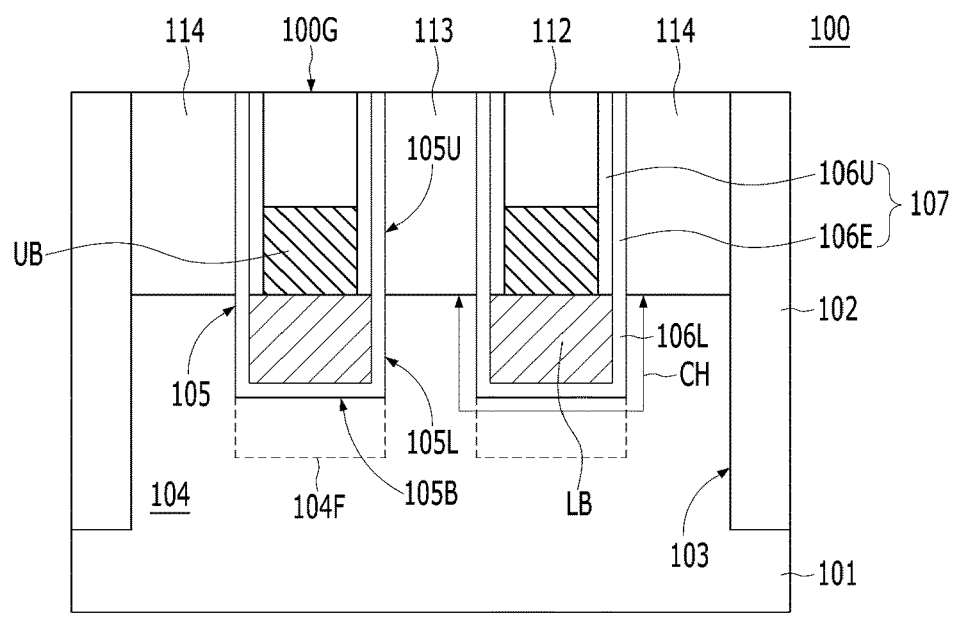
FIG. 2A is a cross-sectional view illustrating the semiconductor device taken along an A-A' line shown in FIG. 1.
Figure 2B:
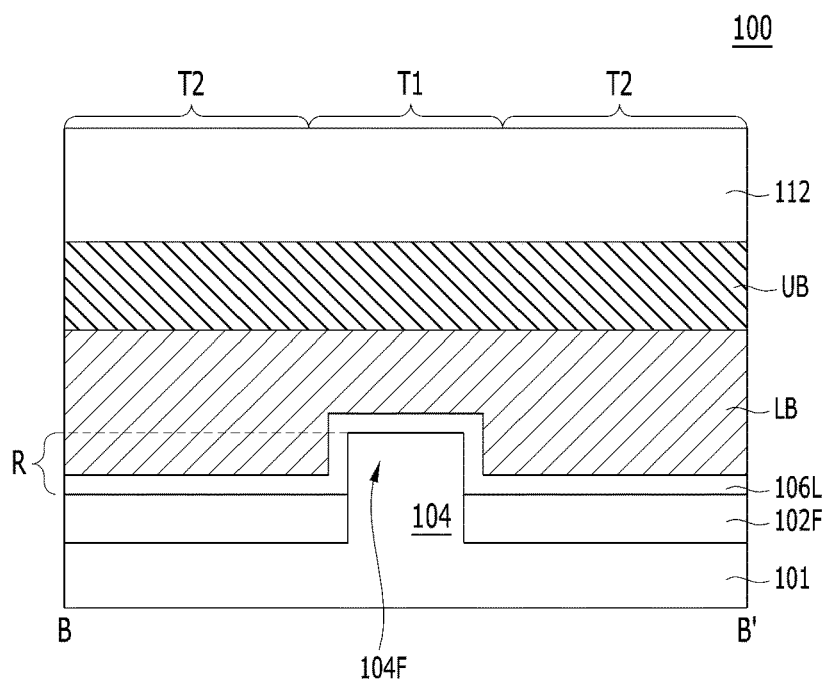
FIG. 2B is a cross-sectional view illustrating the semiconductor device taken along a B-B' line shown in FIG. 1.

FIG. 1 is a plane view illustrating a semiconductor device 100 in accordance with an embodiment of the present invention. FIG. 2A is a cross-sectional view illustrating the semiconductor device 100 taken along an A-A' line shown in FIG. 1. FIG. 2B is a cross-sectional view illustrating the semiconductor device 100 taken along a B-B' line shown in FIG. 1.

Referring to FIGS. 1 to 2B, the semiconductor device 100 may include a buried gate structure 100G, a first doped region 113 and a second doped region 114. An isolation layer 102 and an active region 104 may be formed in a substrate 101. The first and second doped regions 113 and 114 may be formed in the active region 104. A trench 105 may be formed across the active region 104 and the isolation layer 102. The buried gate structure 100G may be formed in the trench 105. A channel CH may be formed between the first doped region 113 and the second doped region 114 by the buried gate structure 100G. The channel CH may be defined along the profile of the trench 105. The semiconductor device 100 may be a part of a memory cell. For example, the semiconductor device 100 may be a cell transistor of a DRAM.

The semiconductor device 100 may include the substrate 101, the first and second doped regions 113, 114 formed spaced apart from each other by the trench 105 in the substrate 101, a first gate dielectric layer 106L formed conformally within the trench 105 to cover the bottom and side wall surfaces of the trench 105, a lower buried portion LB formed on the first gate dielectric layer 106L to fill the lower portion of the trench 105 which was not filled by the first gate dielectric layer 106L, an upper buried portion UB which has a smaller width than the lower buried portion LB and may be formed on the lower buried portion LB, and a second gate dielectric layer 106U formed between the upper buried portion UB and the first gate dielectric layer 106L. The first gate dielectric layer 106L may include an extension portion 106E, and the second gate dielectric layer 106U may be located between the upper buried portion UB and the extension portion 106E of the first gate dielectric layer 106L. The second gate dielectric layer 106U may be formed conformally on the first gate dielectric layer 106L and may extend to cover the whole extent of the sidewall surface of the trench 105 which is not covered by the lower buried portion LB. The upper buried portion UB may be formed on the second gate dielectric layer 106U to fill the open space remaining within the trench 105 but may have a top surface which is positioned lower than the top surface of the substrate 101. The top surfaces of the first and second gate dielectric layers 106L, 106U may be at the same level with the top surface of the substrate 101. The space of the trench 105 which is not filled with the upper buried portion UB may be filled with a capping layer 112.

The semiconductor device 100 may be formed on the substrate 101. The substrate 101 may be any material suitable for semiconductor processing. The substrate 101 may include a semiconductor substrate. The substrate 101 may be formed of a silicon-containing material. The substrate 101 may include silicon, monocrystalline silicon, polysilicon, amorphous silicon, silicon germanium, monocrystalline silicon germanium, polycrystalline silicon germanium, carbon-doped silicon, combinations thereof or multilayers thereof. The substrate 101 may include another semiconductor material, such as germanium. The substrate 101 may include an III/V-group semiconductor substrate, for example, a chemical compound semiconductor substrate such as a gallium arsenide (GaAs). The substrate 101 may include a Silicon-On-Insulator (SOI) substrate.

The isolation layer 102 and the active region 104 may be formed in the substrate 101. The active region 104 may be defined by the isolation layer 102. The isolation layer 102 may be a Shallow Trench Isolation (STI) region formed by trench etching. The isolation layer 102 may be formed by filling a shallow trench, for example, an isolation trench 103, with a dielectric material. The isolation layer 102 may include silicon oxide, silicon nitride or a combination thereof.

The trench 105 is a space in which the buried gate structure 100G may be formed. The trench 105, may be referred to also as a "gate trench". The trench 105 may be formed in the substrate 101. Referring to FIG. 1, the trench 105 may have a line shape extending in any one direction. The trench 105 may have a line shape crossing the active region 104 and the isolation layer 102. The trench 105 may have a shallower depth than the isolation trench 103. The bottom of the trench 105 may be flat as shown in the embodiment of FIGS. 1-2B, however, in some embodiments, the bottom of the trench 105 may be curved. In some embodiments, the lower portion of the trench 105 may have a curvature.

The first and second doped regions 113 and 114 may be formed in the active region 104. The first and second doped regions 113 and 114 are regions doped with conductive dopants. For example, the conductive dopants may include at least one of phosphorus (P), arsenic (As), antimony (Sb) or boron (B). The first and second doped regions 113 and 114 may be doped with the same conductive type of dopants. The first and second doped regions 113 and 114 may be doped with the same conductive dopant. The first and second doped regions 113 and 114 may be located in the active region 104 on both sides of the trench 105. The bottom surfaces of the first and second doped regions 113 and 114 may be located at a predetermined depth from the top surface of the active region 104. The first and second doped regions 113 and 114 may contact the sidewall surface of the trench 105. The bottom surfaces of the first and second doped regions 113 and 114 may be higher than the bottom surface of the trench 105. The first doped region 113 may be referred to as a "first source/drain region" and the second doped region 114 may be referred to as a "second source/drain region".

The trench 105 may include a first trench T1 and a second trench T2. The first trench T1 may be formed in the active region 104. The second trench T2 may be formed in the isolation layer 102. The trench 105 may have a shape that is continuously extended from the first trench T1 to the second trench T2. In the trench 105, the bottom surfaces of the first trench T1 and the second trench T2 may be located at different levels. For example, the bottom surface of the first trench T1 may be located at a higher level than the bottom surface of the second trench T2. A difference in heights between the first trench T1 and the second trench T2 may be formed as the isolation layer 102 is recessed. Thus, the second trench T2 may include a recessed region R having a bottom surface that is lower than the bottom surface of the first trench T1. A fin region 104F may be formed in the active region 104 due to the step height between the bottom surfaces of the first trench T1 and the second trench T2. Thus, the active region 104 may include the fin region 104F.

As described, the fin region 104F may be formed below the first trench T1, and the sidewall surface of the fin region 104F is exposed by a recessed isolation layer 102F. The fin region 104F is a region in which a portion of the channel CH may be formed. The fin region 104F is called a "saddle fin". The fin region 104F may increase the channel width and improve the electrical characteristics.

In some embodiments, the fin region 104F may be omitted.

The buried gate structure 100G may be embedded in the trench 105. The buried gate structure 100G may be disposed in the active region 104 between the first doped region 113 and the second doped region 114, and extended into the isolation layer 102. In the buried gate structure 100G, the bottom surface of a portion disposed in the active region 104 and the bottom surface of a portion disposed in the isolation layer 102 may be located at different levels. When the fin region 104F is omitted, the bottom surface of the portion disposed in the active region 104 and the bottom surface of the portion disposed in the isolation layer 102 may be located at the same level.

The buried gate structure 100G may include the first gate dielectric layer 106L, the lower buried portion LB, the upper buried portion UB, the second gate dielectric layer 106U and the capping layer 112.

The first gate dielectric layer 106L may be conformally formed on the bottom surface and sidewall surface of the trench 105. The first gate dielectric layer 106L may include silicon oxide, silicon nitride, silicon oxynitride, a high-k material or combinations thereof. The high-k material may include a material having a higher dielectric constant than silicon oxide. For example, the high-k material may include any suitable material having a higher dielectric constant than 3.9. In some embodiments, the high-k material may include any suitable material having a higher dielectric constant than 10. In some embodiments, the high-k material may include any suitable material having a dielectric constant ranging from 10 to 30. The high-k material may include at least one metallic element. The high-k material may include a hafnium-containing material. The hafnium-containing material may include hafnium oxide, hafnium silicon oxide, hafnium silicon oxynitride or combinations thereof. In some embodiments, the high-k material may include lanthanum oxide, lanthanum aluminum oxide, zirconium oxide, zirconium silicon oxide, zirconium silicon oxynitride, aluminum oxide or combinations thereof. As the high-k material, other high-k materials may also be selectively used. The first gate dielectric layer 106L may include metal oxide. The first gate dielectric layer 106L may have a shape surrounding the bottom surface and sidewall surface of the lower buried portion LB. The first gate dielectric layer 106L may be located between the channel CH and the lower buried portion LB.

The first gate dielectric layer 106L may include the extension portion 106E, and the extension portion 106E may contact the first and second doped regions 113 and 114.

The top surface of the lower buried portion LB may be located at a lower level than the top surface of the active region 104. The lower buried portion LB may fill the lower portion of the trench 105. The lower buried portion LB may be a low-resistance material to decrease gate sheet resistance. The lower buried portion LB may be a metal-based material. The lower buried portion LB may include a metal, metal nitride or a combination thereof. The lower buried portion LB may include tantalum nitride (TaN), titanium nitride (TiN), tungsten (W), tungsten nitride (WN) or combinations thereof. The lower buried portion LB may be formed of titanium nitride only. In addition, the lower buried portion LB may be formed of a stack of titanium nitride (TiN) and tungsten (W), i.e., TiN/W.

In some embodiments, the lower buried portion LB may have a high work function. The high work function refers to a work function higher than a mid-gap work function of silicon. A low work function refers to a work function lower than the mid-gap work function of silicon. Specifically, the high work function may be higher than 4.5 eV, and the low work function may be lower than 4.5 eV. The lower buried portion LB may include P-type polysilicon.

In some embodiments, the lower buried portion LB may have an increased high work function. The lower buried portion LB may include metal silicon nitride. The metal silicon nitride may be metal nitride doped with silicon. The lower buried portion LB may include metal silicon nitride having an adjusted atomic percent of silicon. For example, the lower buried portion LB may include tantalum silicon nitride (TaSiN) or titanium silicon nitride (TiSiN). Titanium nitride may have a high work function, and contain silicon to further increase the work function thereof. Titanium silicon nitride may have an adjusted atomic percent of silicon, so as to have an increased high work function. In order to have the increased high work function, the atomic percent (at %) of silicon in the titanium silicon nitride may be equal to or less than 21 at %. As a comparative example, in order to have a low work function, the atomic percent (at %) of silicon in the titanium silicon nitride may be equal to or more than 30 at %.

The upper buried portion UB may be formed on the lower buried portion LB, and the top surface of the upper buried portion UB may be located at a lower level than the top surface of the active region 104. The upper buried portion UB may partially fill the upper portion of the trench 105. The upper buried portion UB and the lower buried portion LB may be made of the same material or different materials.

The upper buried portion UB may be a low-resistance material to decrease gate sheet resistance. The upper buried portion UB may be a metal-based material. The upper buried portion UB may include a metal, metal nitride or a combination thereof. The upper buried portion UB may include tantalum nitride (TaN), titanium nitride (TiN), tungsten (W), tungsten nitride (WN) or combinations thereof. The upper buried portion UB may be formed of titanium nitride only. In addition, the upper buried portion UB may be formed of a stack of titanium nitride (TiN) and tungsten (W), i.e., TiN/W. In some embodiments, each of the lower buried portion LB and the upper buried portion UB may be formed of titanium nitride only. In addition, each of the lower buried portion LB and the upper buried portion UB may be formed of a stack of titanium nitride (TiN) and tungsten (W), i.e., TiN/W. The upper buried portion UB may have a smaller width than the lower buried portion LB, and thus the volume of the lower buried portion LB occupied in the trench 105 may be larger. The lower buried portion LB and the upper buried portion UB may have the same height or different heights.

In some embodiments, the upper buried portion UB may have a low work function. The upper buried portion UB may include N-type polysilicon. In some embodiments, the lower buried portion LB may be P-type polysilicon, and the upper buried portion UB may be N-type polysilicon. In some embodiments, the lower buried portion LB may be formed of a stack of titanium nitride and tungsten (TiN/W), and the upper buried portion UB may be N-type polysilicon.

The capping layer 112 may serve to protect the upper buried portion UB. The capping layer 112 may fill the upper portion of the trench 105 on the upper buried portion UB. The top surface of the capping layer 112 may be located at the same level as the top surfaces of the first and second doped regions 113 and 114. For example, the capping layer 112 may include a dielectric material. In some embodiments, the capping layer 112 may include silicon nitride, silicon oxynitride or a combination thereof. In some embodiments, the capping layer 112 may include a combination of silicon nitride and silicon oxide. In some embodiments, the capping layer 112 may include a silicon nitride liner and a Spin-On-Dielectric (SOD) material.

The second gate dielectric layer 106U may be formed between the extension portion 106E of the first gate dielectric layer 106L and the upper buried portion UB. The first gate dielectric layer 106L and the second gate dielectric layer 106U may be made of the same material. The second gate dielectric layer 106U may include silicon oxide, silicon nitride, silicon oxynitride, a high-k material or combinations thereof. The first gate dielectric layer 106L and the second gate dielectric layer 106U may have the same thickness. In some embodiments, the second gate dielectric layer 106U may have a smaller thickness than the first gate dielectric layer 106L. The bottom of the second gate dielectric layer 106U may contact the lower buried portion LB. More specifically, as shown in the embodiment of FIG. 2A, the bottom of the second gate dielectric layer 106U may contact the top surface of an edge of the lower buried portion LB which is not covered by the upper buried portion UB.

The extension portion 106E of the first gate dielectric layer 106L and the second gate dielectric layer 106U may form a dual gate dielectric structure 107. The dual gate dielectric structure 107 may have a larger thickness than the first gate dielectric layer 106L. The dual gate dielectric structure 107 may be located between the upper buried portion UB and the first and second doped regions 113 and 114. The total thickness of the first gate dielectric layer 106L and the second gate dielectric layer 106U may have a larger thickness than the first gate dielectric layer 106L.

The trench 105 may include a bottom surface 105B, lower sidewall surface 105L and upper sidewall surface 105U. The bottom surface 105B and the lower sidewall surface 105L of the trench 105 may be covered by a single gate dielectric structure of the first gate dielectric layer 106L. The upper sidewall surface 105U of the trench 105 may be covered by the dual gate dielectric structure 107, that is, the extension portion 106E of the first gate dielectric layer 106L and the second gate dielectric layer 106U.

As described above, in some embodiments, a GIDL may be improved by the dual gate dielectric structure 107. Also, in some embodiments, the GIDL may be improved by the upper buried portion UB having a low work function. In some preferred embodiments, the GIDL may be improved both by the dual gate dielectric structure 107 and also, by selecting the material of the upper buried portion UB to have a low work function.

Figure 3:
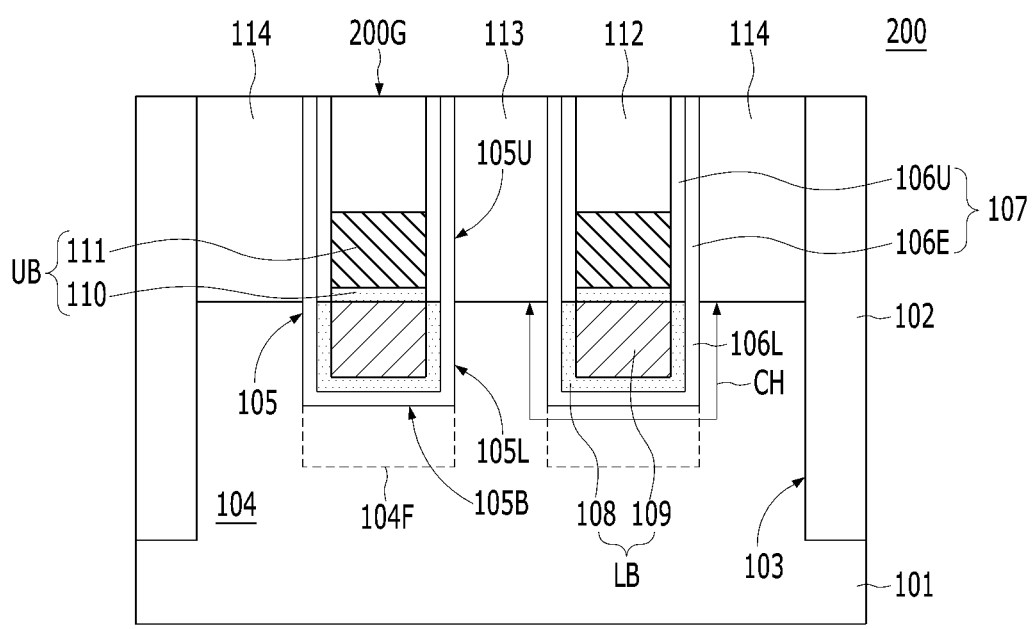
FIG. 3 is a cross-sectional view illustrating a semiconductor device in accordance with an embodiment of the present invention.

FIG. 3 is a cross-sectional view illustrating a semiconductor device 200 in accordance with an embodiment of the present invention. The configurations of the semiconductor device 200 shown in FIG. 3 may be similar to those of the semiconductor device 100 shown in FIG. 2A, except for the configuration of a buried gate structure 200G. Hereinafter, in the present embodiment, detailed descriptions of configurations similar with those of the above-described embodiment may be omitted.

Referring to FIG. 3, the semiconductor device 200 may include the buried gate structure 200G, a first doped region 113 and a second doped region 114. An isolation layer 102 and an active region 104 may be formed in a substrate 101. The first and second doped regions 113 and 114 may be formed in the active region 104. A trench 105 crossing the active region 104 and the isolation layer 102 may be formed. The buried gate structure 200G may be embedded in the trench 105. A channel CH may be formed between the first doped region 113 and the second doped region 114 by the buried gate structure 200G. The channel CH may be defined along the profile of the trench 105. The semiconductor device 200 may be a part of a memory cell. For example, the semiconductor device 200 may be a cell transistor of a DRAM.

The buried gate structure 200G may be embedded in the trench 105. The buried gate structure 200G may be extended into the isolation layer 102 while being disposed in the active region 104 between the first doped region 113 and the second doped region 114. A fin region 104F may be located in the active region 104 below the buried gate structure 200G.

The buried gate structure 200G may include a first gate dielectric layer 106L, a lower buried portion LB, an upper buried portion UB, a second gate dielectric layer 106U and a capping layer 112. The lower buried portion LB may include a first barrier layer 108 and a first gate electrode 109, and the upper buried portion UB may include a second barrier layer 110 and a second gate electrode 111.

The first gate dielectric layer 106L may be conformally formed on the bottom surface and sidewall surface of the trench 105. The first gate dielectric layer 106L may include silicon oxide, silicon nitride, silicon oxynitride, a high-k material or combinations thereof. The high-k material may include a material having a higher dielectric constant than silicon oxide. For example, the high-k material may include any suitable material having a higher dielectric constant than 3.9. In some embodiments, the high-k material may include any suitable material having a higher dielectric constant than 10. In some embodiments, the high-k material may include any suitable material having a dielectric constant ranging from 10 to 30. The high-k material may include at least one metallic element. The high-k material may include a hafnium-containing material. The hafnium-containing material may include hafnium oxide, hafnium silicon oxide, hafnium silicon oxynitride or combinations thereof. In some embodiments, the high-k material may include lanthanum oxide, lanthanum aluminum oxide, zirconium oxide, zirconium silicon oxide, zirconium silicon oxynitride, aluminum oxide or combinations thereof. As the high-k material, other publicly-known high-k materials may also be selectively used. The first gate dielectric layer 106L may include metal oxide. The first gate dielectric layer 106L may have a shape surrounding the bottom surface and sidewall surface of the lower buried portion LB. The first gate dielectric layer 106L may be located between the channel CH and the lower buried portion LB.

The first gate dielectric layer 106L may include an extension portion 106E, and the extension portion 106E may contact the first and second doped regions 113 and 114.

The first barrier layer 108 may be conformally formed on the first gate dielectric layer 106L. The first gate electrode 109 may be formed on the first barrier layer 108 to fill a space of the trench left unfilled by the first barrier layer 108 and the first gate dielectric layer 106L. The top surfaces of the first barrier layer 108 and first gate electrode 109 may be located at a lower level than the top surface of the active region 104. The top surfaces of the first barrier layer 108 and first gate electrode 109 may be located at the same level. The top surfaces of the first barrier layer 108 and first gate electrode 109 may be located at the same level as the bottom surfaces of the first and second doping regions 113, 114. The first barrier layer 108 and the first gate electrode 109 may fill the lower portion of the trench 105. The first barrier layer 108 and the first gate electrode 109 may preferably be made of different low-resistance materials. In some embodiments the first barrier layer 108 and the first gate electrode 109 may be made of different metal-based materials.

In some embodiments, the first barrier layer 108 may include metal nitride. The first barrier layer 108 may be formed of tantalum nitride (TaN) or titanium nitride (TiN). In some embodiments, the first barrier layer 108 may have a high work function. The high work function refers to a work function higher than a mid-gap work function of silicon. A low work function refers to a work function lower than the mid-gap work function of silicon. Specifically, the high work function may be higher than 4.5 eV, and the low work function may be lower than 4.5 eV.

The first barrier layer 108 may have an increased high work function. For, example, the first barrier layer 108 may include metal silicon nitride. The metal silicon nitride may be metal nitride doped with silicon. The first barrier layer 108 may be metal silicon nitride having an adjusted atomic percent of silicon. For example, the first barrier layer 108 may be tantalum silicon nitride (TaSiN) or titanium silicon nitride (TiSiN). Titanium nitride may have a high work function, and contain silicon to further increase the work function thereof. Titanium silicon nitride may have an adjusted atomic percent of silicon, so as to have an increased high work function. In order to have the increased high work function, the atomic percent (at %) of silicon in the titanium silicon nitride may be equal to or less than 21 at %. As a comparative example, in order to have a low work function, the atomic percent (at %) of silicon in the titanium silicon nitride may be equal to or more than 30 at %.

The first gate electrode 109 may include a metal or metal nitride. The first gate electrode 109 may include tungsten or titanium nitride. When tungsten is used as the first gate electrode 109, the first gate dielectric layer 106L may be damaged by the processes employed to form the first gate electrode 109. For example, a tungsten layer may be deposited using tungsten hexafluoride ($WF_6$) gas, and the first gate dielectric layer 106L may be attacked by fluorine. To prevent fluorine from attacking the first gate dielectric layer 106L the present invention employs the first barrier layer 108 which may be formed between the first gate electrode 109 and the first gate dielectric layer 106L. For example, in a preferred embodiment, the first gate electrode 109 may be formed of tungsten (W), and the first barrier layer 108 may be formed of titanium nitride (TiN) which is resistant to fluorine attack. The lower buried portion LB may include a stack of TiN/W.

The second barrier layer 110 may be formed on the first gate electrode 109. The second barrier layer 110 may be formed between the first gate electrode 109 and the second gate electrode 111. The first and second barrier layers 108 and 110 may be made of the same material or different materials. The second barrier layer 110 may include metal nitride. The second barrier layer 110 may be formed of tantalum nitride (TaN) or titanium nitride (TiN). As will be described below, the second barrier layer 110 may be formed by a deposition process such as physical vapor deposition or by a plasma treatment such as plasma nitridation.

The second gate electrode 111 may be formed on the second barrier layer 110. The top surface of the second gate electrode 111 may be located at a lower level than the top surface of the active region 104. The second barrier layer 110 and the second gate electrode 111 may partially fill the upper portion of the trench 105. The second gate electrode 111 may include a low work function material. The second gate electrode 111 may include polysilicon having a low work function, for example, polysilicon doped with an N-type impurity.

The capping layer 112 may serve to protect the second gate electrode 111. The capping layer 112 may fill the upper portion of the trench 105 on the second gate electrode 111. For example, the capping layer 112 may include a dielectric material. In some embodiments, the capping layer 112 may include silicon nitride, silicon oxynitride or a combination thereof. In some embodiments, the capping layer 112 may include a combination of silicon nitride and silicon oxide. The capping layer 112 may include a silicon nitride liner and a Spin-On-Dielectric (SOD) material.

The second gate dielectric layer 106U may be formed between the extension portion 106E of the first gate dielectric layer 106L and the second gate electrode 111. The first gate dielectric layer 106L and the second gate dielectric layer 106U may be made of the same material. The second gate dielectric layer 106U may include silicon oxide, silicon nitride, silicon oxynitride, a high-k material or combinations thereof. The first gate dielectric layer 106L and the second gate dielectric layer 106U may have the same thickness. In some embodiments, the second gate dielectric layer 106U may have a smaller thickness than the first gate dielectric layer 106L. The bottom of the second gate dielectric layer 106U may contact the first and second barrier layers 108 and 110. Specifically, the bottom surface of the second gate dielectric layer 106U may contact the top surface of an edge of the first barrier layer 108. Also, a side surface of a bottom portion of the second gate dielectric layer 106U may contact the surface of an edge of the second barrier layer 110.

The extension portion 106E of the first gate dielectric layer 106L and the second gate dielectric layer 106U may form a dual gate dielectric structure 107. The dual gate dielectric structure 107 may have a larger thickness than the first gate dielectric layer 106L. The dual gate dielectric structure 107 may be located between the second gate electrode 111 and the first and second doped regions 113 and 114.

The trench 105 may include a bottom surface 105B, lower sidewall surface 105L and upper sidewall surface 105U. The bottom surface 105B and the lower sidewall surface 105L of the trench 105 may be covered by a single gate dielectric structure of the first gate dielectric layer 106L. The upper sidewall surface 105U of the trench 105 may be covered by the dual gate dielectric structure 107, that is, the extension portion 106E of the first gate dielectric layer 106L and the second gate dielectric layer 106U.

As described above, in some embodiments, a GIDL may be improved by the dual gate dielectric structure 107. Also, in some embodiments, the GIDL may be improved by the second gate electrode 111 having a low work function. In some preferred embodiments the GIDL may be improved both by the dual gate dielectric structure 107 and also, by selecting the material of the second gate electrode 111 to have a low work function.

FIGS. 4A to 4J are cross-sectional views illustrating a method for forming a semiconductor device in accordance with an embodiment of the present invention. FIGS. 4A to 4J illustrates a method for forming the semiconductor device 200 shown in FIG. 3.

Figure 4A:
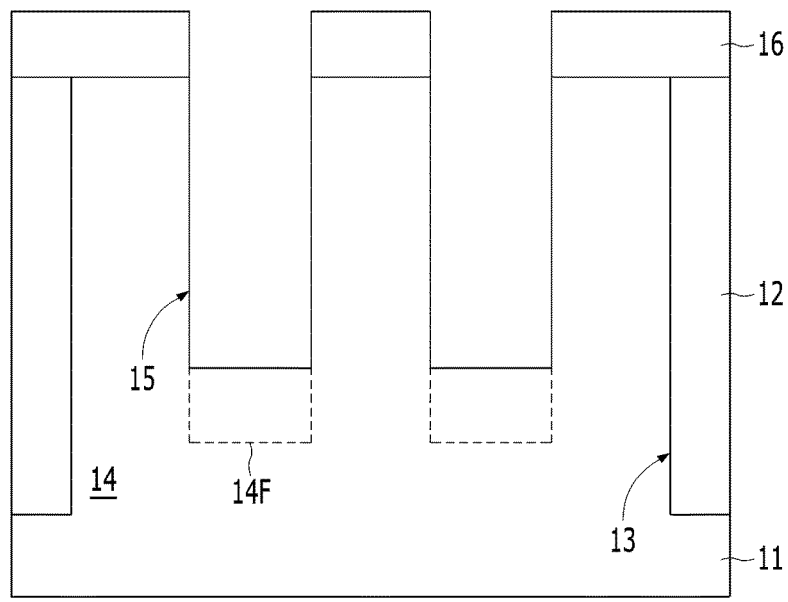
FIGS. 4A to 4J are cross-sectional views illustrating a method for forming a semiconductor device in accordance with an embodiment of the present invention.

As illustrated in FIG. 4A, an isolation layer 12 may be formed in a substrate 11. An active region 14 is defined by the isolation layer 12. The isolation layer 12 may be formed by a Shallow Trench Isolation (STI) process. For example, an isolation trench 13 may be formed by etching the substrate 11. The isolation trench 13 is filled with a dielectric material, and thus the isolation layer 12 may be formed. The isolation layer 12 may include silicon oxide, silicon nitride, or a combination thereof. The isolation trench 13 may be filled with a dielectric material through a Chemical Vapor Deposition (CVD) process or another deposition process. Also, a planarization process such as Chemical-Mechanical Polishing (CMP) may be additionally performed.

A plurality of trenches 15 may then be formed in the substrate 11. Each of the trenches 15 may have a line shape crossing the active region 14 and the isolation layer 12. The trenches 15 may be formed by an etch process of the substrate 11 using a hard mask layer 16 as an etch mask. The hard mask layer 16 may be formed on the substrate 11, and have line-shaped openings. The hard mask layer 16 may be formed of a material having an etch selectivity to the substrate 11. The hard mask layer 16 may be silicon oxide, such as Tetra-Ethyl-Ortho-Silicate (TEOS). The trenches 15 may be formed to be shallower than the isolation trench 13. The trenches 15 may be sufficiently deep to make a large average cross-sectional area of a gate electrode, which is to be formed subsequently. In this way, the resistance of the gate electrode may be decreased. In some embodiments, the bottom edge of the trenches 15 may have a curvature.

Subsequently, a fin region 14F may be formed. The fin region 14F may be formed by selectively recessing the isolation layer 12 below each trench 15. The structure of the fin region 14F may be referred to the fin region 104F of FIG. 2B.

Figure 4B:
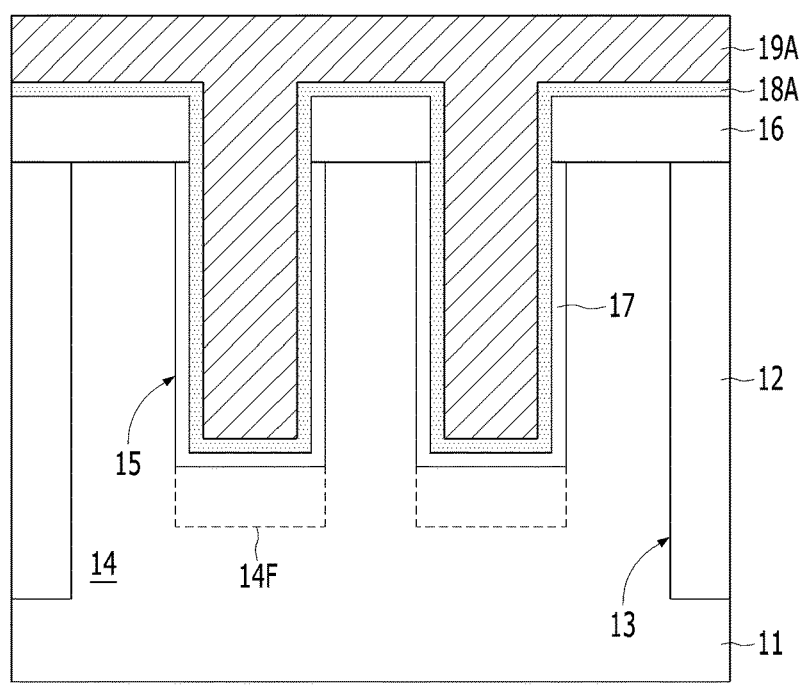

Referring to FIG. 4B, a first gate dielectric layer 17 may be formed on the surface of each of the trenches 15. Before the first gate dielectric layer 17 may be formed, the inside surface of each of the trenches 15 that is damaged from the etch process may be recovered. For example, sacrificial oxide may be formed by a thermal oxidation treatment, and then the sacrificial oxide may be removed.

For example, the first gate dielectric layer 17 may be formed by a thermal oxidation process. The first gate dielectric layer 17 may include silicon oxide.

In some embodiments, the first gate dielectric layer 17 may be formed by a deposition process, such as a CVD process or an Atomic Layer Deposition (ALD) process. The first gate dielectric layer 17, which may be formed by the deposition process, may include a high-k material, oxide, nitride, oxynitride or combinations thereof. The high-k material may include a hafnium-containing material. The hafnium-containing material may include hafnium oxide, hafnium silicon oxide, hafnium silicon oxynitride or combinations thereof. In some embodiments, the high-k material may include lanthanum oxide, lanthanum aluminum oxide, zirconium oxide, zirconium silicon oxide, zirconium silicon oxynitride, aluminum oxide or combinations thereof. As the high-k material, other publicly-known high-k materials may also be selectively used. The first gate dielectric layer 17 may include a material having a high oxygen atom density.

A first barrier material 18A may be formed on the first gate dielectric layer 17 and the hard mask layer 16. The first barrier material 18A may be conformally formed on the surface of the first gate dielectric layer 17. The first barrier material 18A may include a metal-based material. The first barrier material 18A may include metal nitride. The first barrier material 18A may include titanium nitride or tantalum nitride. The first barrier material 18A may be formed by the ALD or CVD process.

A first conductive layer 19A may be formed on the first barrier material 18A. The first conductive layer 19A may be formed on the first barrier material 18A to fill each trench 15. The first conductive layer 19A includes a low-resistance metal material. The first conductive layer 19A may include tungsten. The first conductive layer 19A may be formed by the CVD or ALD process.

Figure 4C:
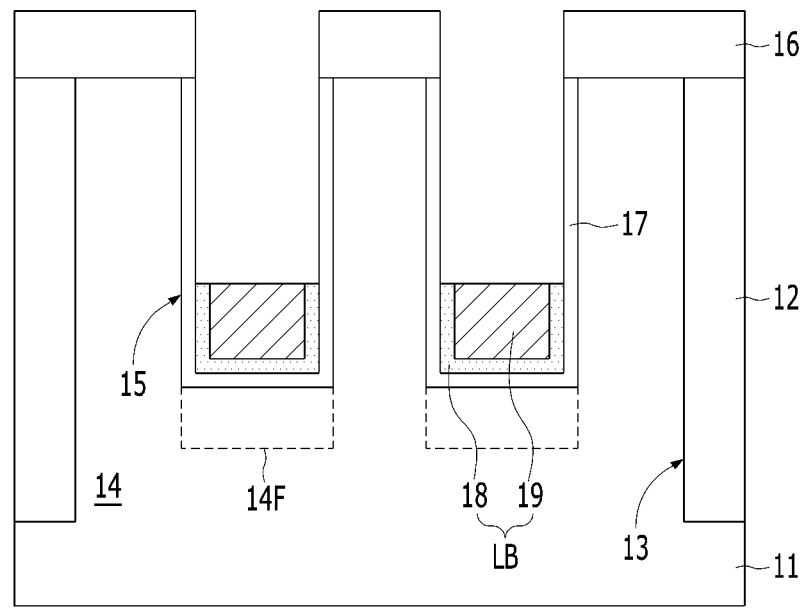

As illustrated in FIG. 4C, a first barrier layer 18 and a first gate electrode 19 may be formed inside each trench 15. In order to form the first barrier layer 18 and the first gate electrode 19, a recessing process may be performed. The recessing process may be performed by a dry etch process, for example, an etch-back process. The first barrier layer 18 may be formed by performing the etch-back process on the first barrier material 18A. The first gate electrode 19 may be formed by performing the etch-back process on the first conductive layer 19A. In some embodiments, a planarization process may be performed in advance to expose the top surface of the hard mask layer 16, and then the etch-back process of the recessing process may be performed. The top surfaces of the first barrier layer 18 and the first gate electrode 19 may be located at the same level.

The top surfaces of the first barrier layer 18 and the first gate electrode 19 may be recessed at a lower level than the top surface of the active region 14. The first barrier layer 18 and the first gate electrode 19 may be abbreviated as a "lower buried portion LB".

After the first barrier layer 18 and the first gate electrode 19 are formed, the surface of the first gate dielectric layer 17 may be partially exposed.

Figure 4D:
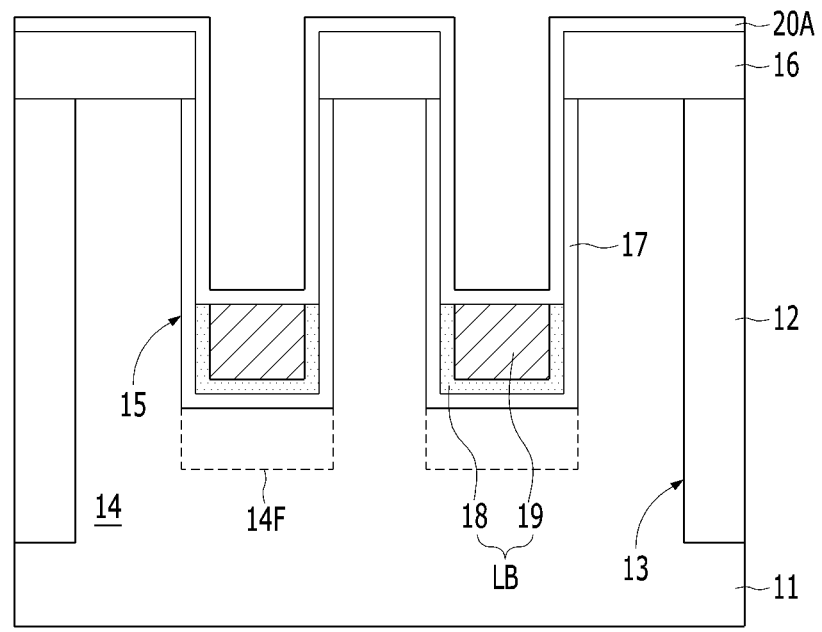

As illustrated in FIG. 4D, a second gate dielectric layer 20A may be formed on the first barrier layer 18 and the first gate electrode 19. The second gate dielectric layer 20A may be conformally formed. For example, the second gate dielectric layer 20A may be formed by ALD or CVD. The second gate dielectric layer 20A may be made of the same material or a different material as or from the first gate dielectric layer 17. The first gate dielectric layer 17 and the second gate dielectric layer 20A may have the same thickness. In some embodiments, the second gate dielectric layer 20A may have a smaller or larger thickness than the first gate dielectric layer 17.

For example, the second gate dielectric layer 20A may be formed by the CVD or ALD process. The second gate dielectric layer 20A may include a high-k material, oxide, nitride, oxynitride or combinations thereof. The high-k material may include a hafnium-containing material. The hafnium-containing material may include hafnium oxide, hafnium silicon oxide, hafnium silicon oxynitride or combinations thereof. In some embodiments, the high-k material may include lanthanum oxide, lanthanum aluminum oxide, zirconium oxide, zirconium silicon oxide, zirconium silicon oxynitride, aluminum oxide or combinations thereof. As the high-k material, other publicly-known high-k materials may also be selectively used. The second gate dielectric layer 20A may include a material having a low oxygen atom density. The second gate dielectric layer 20A may include a material having a lower oxygen atom density than the first gate dielectric layer 17.

Figure 4E:
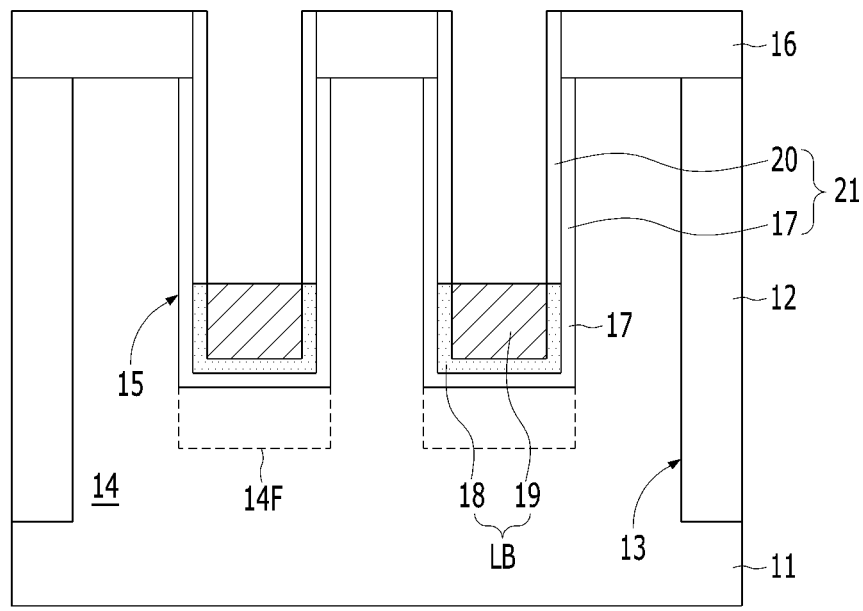

As illustrated in FIG. 4E, an etch process may be performed on the second gate dielectric layer 20A. For example, an etch-back process may be performed on the second gate dielectric layer 20A, and a second gate dielectric layer 20 having a spacer shape may remain by the etch-back process. The second gate dielectric layer 20 may cover the top surface of the first barrier layer 18, and expose the top surface of the first gate electrode 19. The second gate dielectric layer 20 may cover an exposed part of the first gate dielectric layer 17 on the first barrier layer 18. The second gate dielectric layer 20 may be extended to cover the sidewall surface of the hard mask layer 16. The second gate dielectric layer 20 may not cover the top surface of the hard mask layer 16. In some embodiments, a part of the second gate dielectric layer 20 may cover the top surface of the hard mask layer 16.

Through a series of processes described above, a dual gate dielectric layer 21 including the first and second gate dielectric layers 17 and 20 may be formed. The dual gate dielectric layer 21 may cover the surface of each trench 15. The first gate dielectric layer 17 of the dual gate dielectric layer 21 may fully cover the surface of each trench 15, and the second gate dielectric layer 20 thereof may partially cover the first gate dielectric layer 17.

The sidewall surface of each trench 15 may be divided into a lower sidewall surface 15L and an upper sidewall surface 15U, and the lower sidewall surface 15L may have smaller heights than the upper sidewall surface 15U. The lower sidewall surface 15L may be portions extending from the bottom surface of each trench 15, and the upper sidewall surface 15U may be portions extending from the lower sidewall surface 15L. The first gate dielectric layer 17 may cover the bottom surface 15B, the lower sidewall surface 15L and the upper sidewall surface 15U of each trench 15, and the second gate dielectric layer 20 may cover the upper sidewall surface 15U of the trench 15 on the first gate dielectric layer 17. A part of the first gate dielectric layer 17 may be located between the second gate dielectric layer 20 and the upper side wall 15U of each trench 15. The first gate dielectric layer 17 may be located between the first barrier layer 18 and the lower side wall 15L of each trench 15.

As described above, the bottom surface 15B and the lower sidewall surface 15L of the trench 15 may be covered with a single structure of the first gate dielectric layer 17, and the upper sidewall surface 15U of the trench 15 may be covered with a dual structure of the first gate dielectric layer 17 and the second gate dielectric layer 20.

Figure 4F:
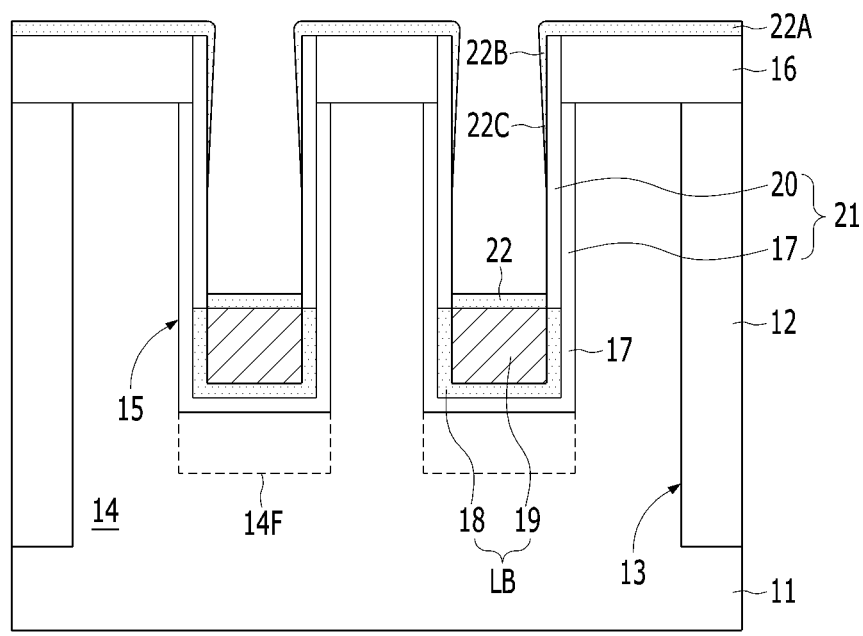

As illustrated in FIG. 4F, a second barrier layer 22 may be formed on the top surface of the first gate electrode 19. The first and second barrier layers 18 and 22 may be formed of the same material or different materials. The second barrier layer 22 may include a metal-based material. The second barrier layer 22 may include metal nitride. The second barrier layer 22 may include titanium nitride, tantalum nitride, tungsten nitride or combinations thereof. The second barrier layer 22 may be non-conformally formed. The non-conformal second barrier layer 22 may be formed by Physical Vapor Deposition (PVD). For example, according to the PVD, the second barrier layer 22 may cover the top surface of the first gate electrode 19, and not cover a part of the second gate dielectric layer 20.

When the second barrier layer 22 is deposited, first to third dummy materials 22A, 22B and 22C may be formed. The first to third dummy materials 22A, 22B and 22C may be made of the same material as the second barrier layer 22. The first dummy material 22A may cover the top surface of the hard mask layer 16, the second dummy material 22B may extend from the first dummy material 22A and cover the sidewall surfaces of the hard mask layer 16, and the third dummy material 22C may extend from the second dummy material 22B and cover a part of the top of the second gate dielectric layer 20.

As described above, when the second barrier layer 22 is deposited, the first to third dummy materials 22A, 22B and 22C may be formed. The second barrier layer 22 may be a covering portion that covers the top surface of the bottom buried portion LB, and the first to third dummy materials 22A, 22B and 22C may be dummy portions that partially cover the second gate dielectric layer 20. The second barrier layer 22 and the first to third dummy materials 22A, 22B and 22C may be non-conformally deposited not to contact each other.

The second barrier layer 22 may include titanium nitride deposited by the PVD, that is, PVD TiN. The second barrier layer 22 may serve to prevent inter-diffusion or interaction between the first gate electrode 19 and a subsequent second gate electrode. The first to third dummy materials 22A, 22B and 22C may be removed in a subsequent process.

Figure 4G:
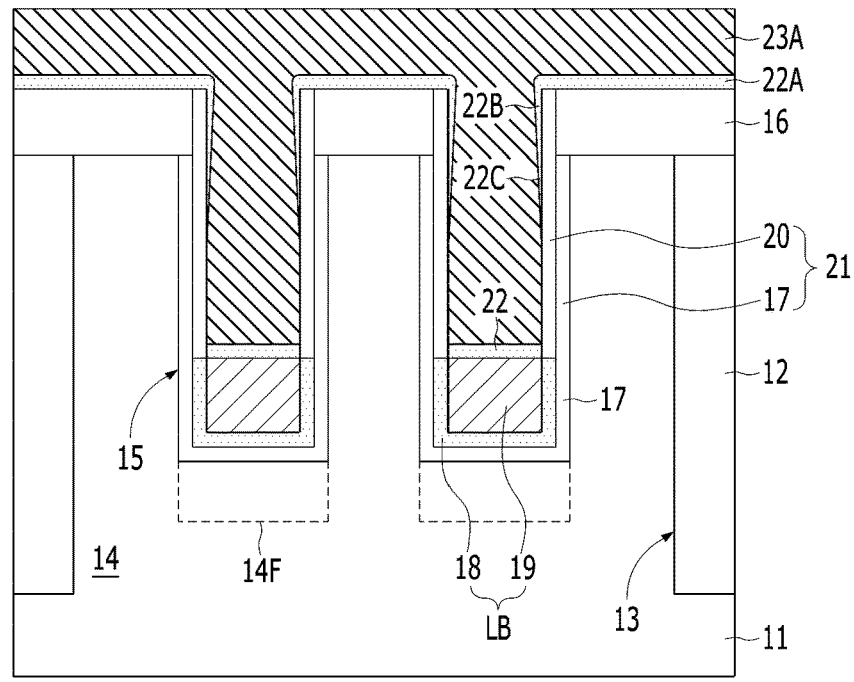

As illustrated in FIG. 4G, a second conductive layer 23A may be formed on the second barrier layer 22 and the second gate dielectric layer 20. The second conductive layer 23A may be formed on the second gate dielectric layer 20 and may fill each trench 15. The second conductive layer 23A may include a material having a low work function. The second conductive layer 23A may include polysilicon having a low work function, for example, polysilicon doped with an N-type impurity. The second conductive layer 23A may be formed by CVD or ALD. In some embodiments, the first gate electrode 19 and the second conductive layer 23A may be made of different materials. In some embodiments, the first gate electrode 19 and the second conductive layer 23A may be made of the same material. The second conductive layer 23A may be formed of a low-resistance material to decrease gate sheet resistance.

Figure 4H:
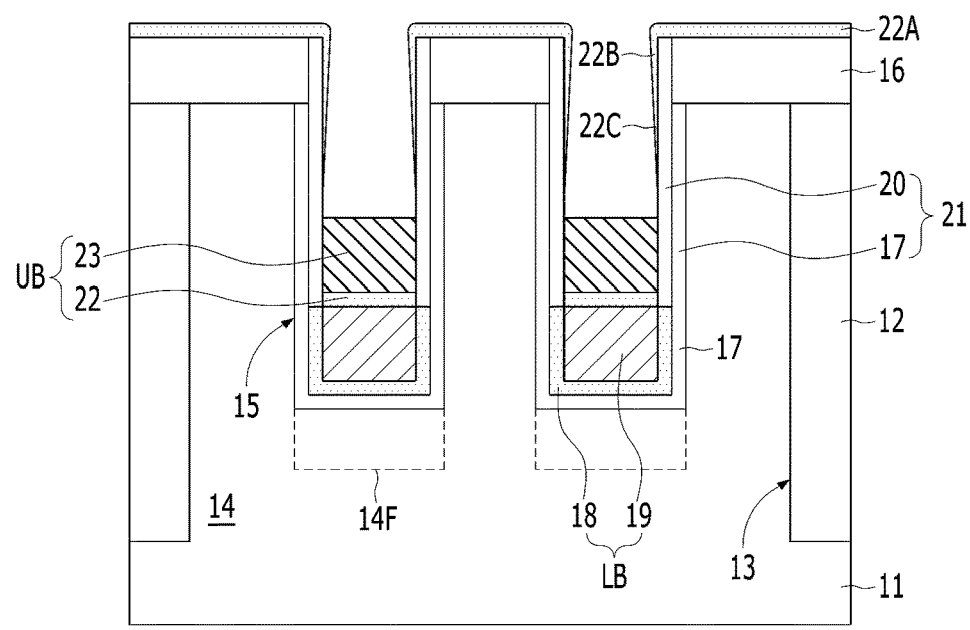

As illustrated in FIG. 4H, a second gate electrode 23 may be formed in each trench 15. In order to form the second gate electrode 23, a recessing process may be performed. The recessing process may be performed by a dry etch process, for example, an etch-back process. The second gate electrode 23 may be formed by performing the etch-back process on the second conductive layer 23A. In some embodiments, a planarization process may be performed in advance to expose the hard mask layer 16, and then the etch-back process of the recessing process may be performed. The top surface of the second gate electrode 23 may be recessed at a lower level than the top surface of the active region 14.

The first to third dummy materials 22A, 22B and 22C may serve to protect the second gate dielectric layer 20 while the etch-back process is performed on the second conductive layer 23A. In other words, the second gate dielectric layer 20 may be protected from getting damaged while the etch-back process of the second conductive layer 23A is performed.

The third dummy layer 22C may not remain on the contact surface between the second gate electrode 23 and the second gate dielectric layer 20. To this end, the height of the second gate electrode 23 may be adjusted.

In addition, while the etch-back process is performed on the second conductive layer 23A, the second gate dielectric layer 20 may be exposed, and the first gate dielectric layer 17 may not be exposed. As a result, the etch-back process performed on the second conductive layer 23A may prevent the first gate dielectric layer 17 from getting damaged. The second gate dielectric layer 20 may serve as a protective layer for preventing the etch damage to the first gate dielectric layer 17. A part of the second gate dielectric layer 20 may be damaged while the etch-back process is performed on the second conductive layer 23A. Nevertheless, since the first gate dielectric layer 17 remains without damage, a GIDL may be improved.

The second barrier layer 22 and the second gate electrode 23 may be referred to as an upper buried portion UB. Accordingly, a dual buried gate structure including the lower buried portion LB and the upper buried portion UB may be formed. The lower buried portion LB may include the first gate electrode 19 having low resistance, and the upper buried portion UB may include the second gate electrode 23 having a low work function. The gate resistance of the dual buried gate structure may be lowered by the first gate electrode 19, and the GIDL may be improved by the second gate electrode 23. The second barrier layer 22 may prevent inter-diffusion and interaction between the first gate electrode 19 and the second gate electrode 23. Since the second barrier layer 22 is not present on the side wall of the second gate electrode 23, the GIDL may be further improved by the second gate electrode 23.

Figure 4I:
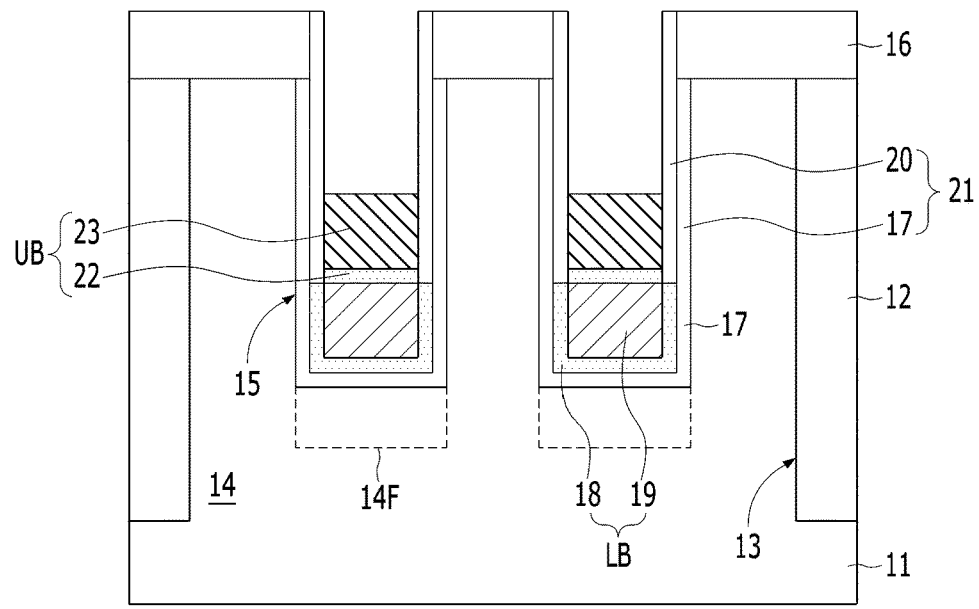

As illustrated in FIG. 4I, the first to third dummy layers 22A, 22B and 22C may be removed. The first to third dummy layers 22A, 22B and 22C may be removed, for example, by a wet etch process. At this time, the hard mask layer 16, the second gate dielectric layer 20 and the second gate electrode 23 may not be lost. As the first to third dummy layers 22A, 22B and 22C are removed, the surface of the second gate dielectric layer 20 may be exposed.

In some embodiments, the first to third dummy layers 22A, 22B and 22C may not remain when the process of forming the second gate electrode 23 is completed. In other words, all of the first to third dummy layers 22A, 22B and 22C may be removed at the time when the etch-back process performed on the second conductive layer 23A is completed.

Figure 4J:
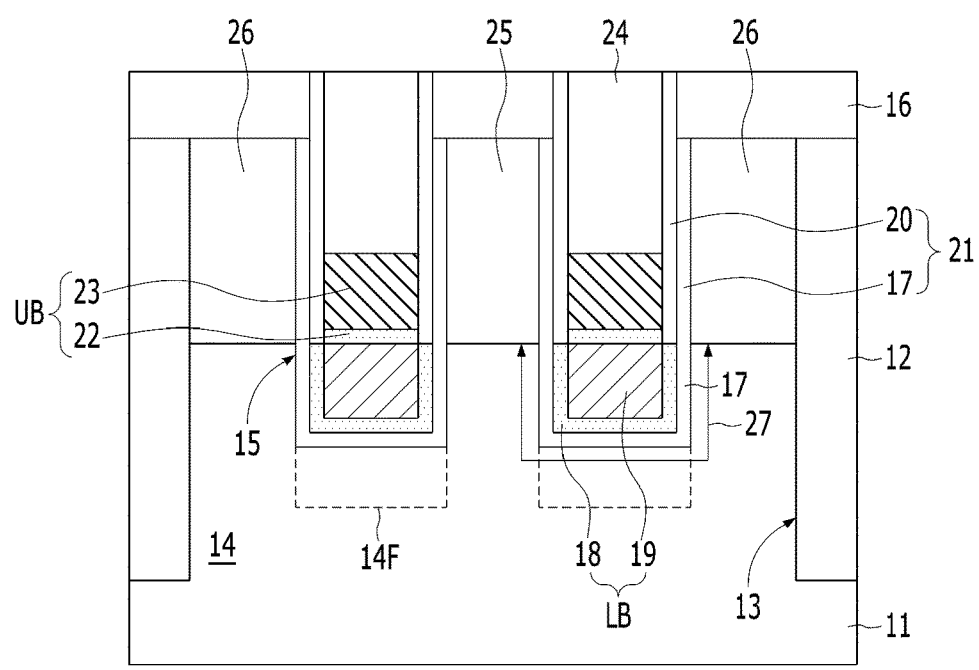

As illustrated in FIG. 4J, a capping layer 24 may be formed on the second gate electrode 23 and the second gate dielectric layer 20. The capping layer 24 includes a dielectric material. The capping layer 24 may include silicon nitride. Subsequently, the capping layer 24 may be planarized so that the top surface of the hard mask layer 16 is exposed. The capping layer 24 may have an Oxide-Nitride-Oxide (ONO) structure.

Through a series of processes described above, a buried gate structure may be formed. The buried gate structure includes the first gate dielectric layer 17, the first barrier layer 18, the first gate electrode 19, the second gate dielectric layer 20, the second barrier layer 22, the second gate electrode 23 and the capping layer 24. The top surface of the second gate electrode 23 is located at a lower level than the top surface of the active region 14. As the top surface of the second gate electrode 23 is recessed at a low level, a physical distance between the second gate electrode 23 and the peripheral conductive material, e.g., a contact plug, may be sufficiently secured.

After the capping layer 24 may be formed, a doping process of an impurity is performed by implantation or other doping technique. Accordingly, a first doped region 25 and a second doped region 26 are formed in the substrate 11. The first and second doped regions 25 and 26 may have a depth that horizontally overlaps the second gate electrode 23 and the second gate dielectric layer 20. The second gate dielectric layer 20 may horizontally overlap the first and second doped regions 25 and 26. The first barrier layer 18 and the first gate electrode 19 may not horizontally overlap the first and second doped regions 25 and 26. The lowest portion of the second gate dielectric layer 20 may be at the same level as the lowest portions of the first and second doped regions 25 and 26.

As the first and second doped regions 25 and 26 are formed, a channel 27 may be defined along the surface of each trench 15. The length of the channel 27 may be defined by the lower buried portion LB.

The first gate dielectric layer 17 may be located between the lower buried portion LB and the channel 27, and the first and second gate dielectric layers 17 and 20 may be located between the upper buried portion UB and the first and second doped regions 25 and 26. Specifically, a single gate dielectric structure formed of the first gate dielectric layer 17 may be located between the lower buried portion LB and the channel 27, and the dual gate dielectric structure 21 formed of the first and second gate dielectric layers 17 and 20 may be located between the second gate electrode 23 and the first and second doped regions 25 and 26. The dual gate dielectric structure 21 may have a larger thickness than the single gate dielectric structure.

Figure 5:
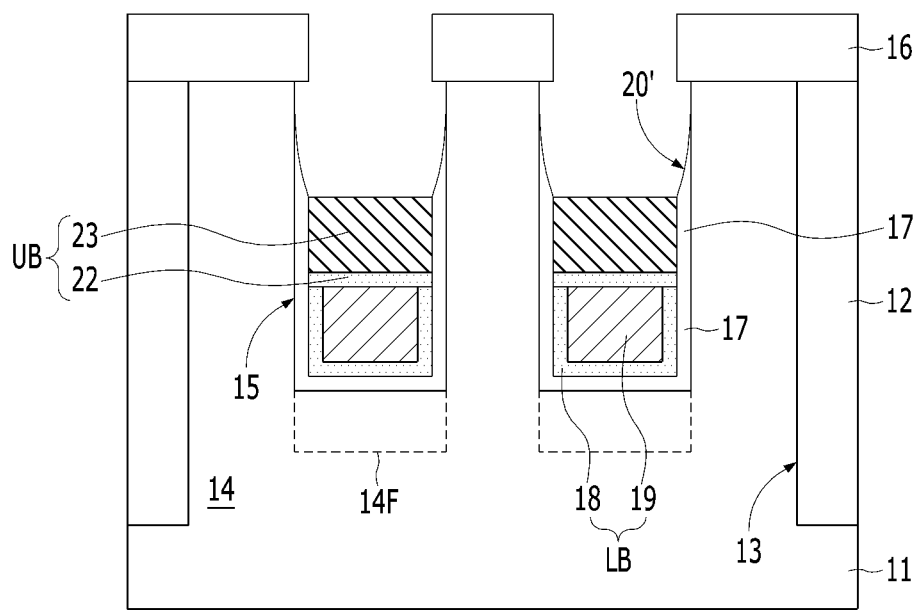
FIG. 5 is a cross-sectional view illustrating damage of a gate dielectric layer because of fluorine according to a comparative example.

FIG. 5 is a cross-sectional view illustrating damage of a gate dielectric layer because of fluorine according to a comparative example.

FIG. 5 shows an example in which the second gate dielectric layer 20 is omitted, and the surface of the first gate dielectric layer 17 may be subjected to an attack 20' while the etch-back process is performed on the second conductive layer 23A. Herein, the attack 20' on the first gate dielectric layer 17 may include a case where the surface of the first gate dielectric layer 17 is damaged or a part thereof is lost.

As such, when the attack 20' on the first gate dielectric layer 17 occurs, a GIDL may be increased.

As the second gate dielectric layer 20 may be formed according to the present embodiment, the first gate dielectric layer 17 may be prevented from being damaged, and thus the GIDL may be improved.

FIGS. 6A to 6D are cross-sectional views illustrating another method for forming a semiconductor device. The method illustrated in FIGS. 6A to 6D may be similar to the method illustrated in FIGS. 4A to 4J.

Through the method illustrated in FIG. 4A to 4E, a second gate dielectric layer 20 covering an exposed part of a first gate dielectric layer 17 may be formed on a lower buried portion LB.

Figure 6A:
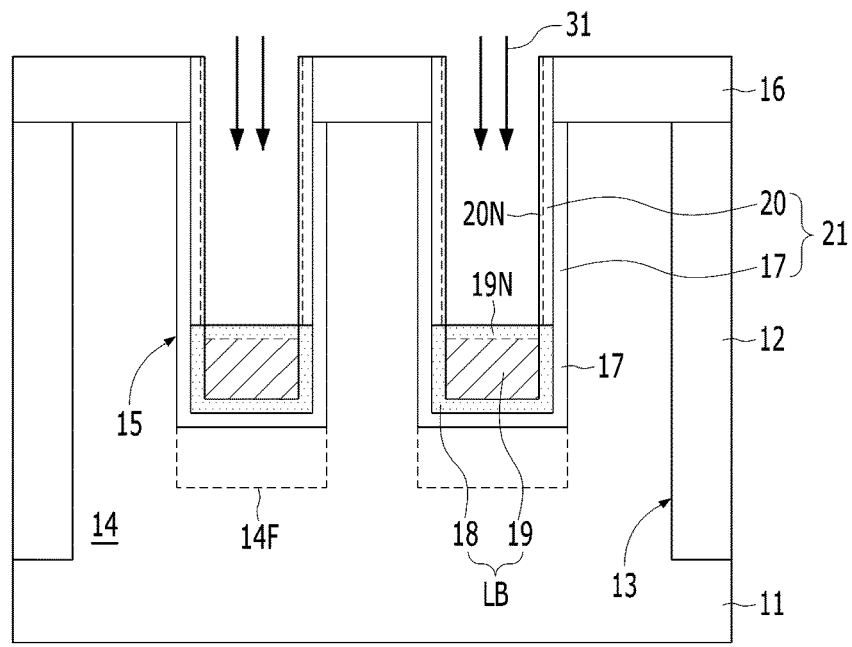
FIGS. 6A to 6D are cross-sectional views illustrating another method for forming a semiconductor device.

Subsequently, as illustrated in FIG. 6A, a plasma treatment 31 may be performed on a substrate 11 in which the second gate dielectric layer 20 may be formed. The plasma treatment 31 may be performed in the atmosphere of a nitrogen-containing gas or an oxygen-containing gas. The plasma treatment 31 may include plasma nitridation or plasma oxidation.

The top surface of the lower buried portion LB may be modified by the plasma treatment 31. For example, the top surface of the lower buried portion LB may be nitrided by plasma nitridation. A second barrier layer 19N may be formed by such plasma nitridation. The second barrier layer 19N may be a portion in which the top surface of a first gate electrode 19 is nitrided. The second barrier layer 19N may be a nitride of the first gate electrode 19. When the first gate electrode 19 includes tungsten, the second barrier layer 19N may be tungsten nitride.

In some embodiments, the surface of the second gate dielectric layer 20 may be modified during the plasma treatment 31. For example, the surface of the second gate dielectric layer 20 may be nitrided (refer to reference numeral '20N').

As described above, the second barrier layer 19N may be selectively formed only on the top surface of the lower buried portion LB.

Figure 6B:
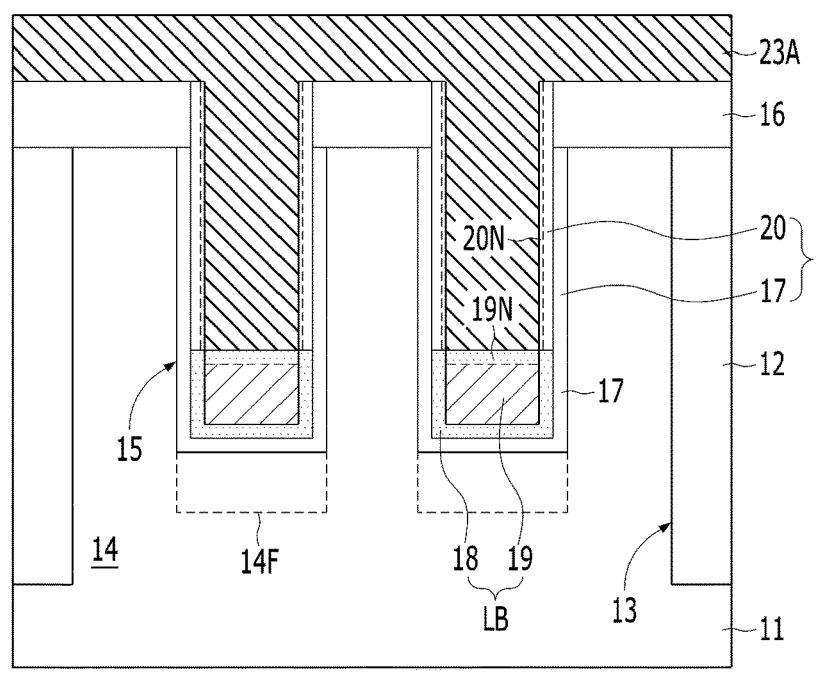

As illustrated in FIG. 6B, a second conductive layer 23A may be formed on the second barrier layer 19N and the second gate dielectric layer 20. The second conductive layer 23A may be formed on the second gate dielectric layer 20 to fill each trench 15. The second conductive layer 23A includes a material having a low work function. The second conductive layer 23A may include polysilicon having a low work function, for example, polysilicon doped with an N-type impurity. The second conductive layer 23A may be formed by CVD or ALD. The first gate electrode 19 and the second conductive layer 23A may be made of different materials. In some embodiments, the first gate electrode 19 and the second conductive layer 23A may be made of the same material. The second conductive layer 23A may be formed of a low-resistance material to decrease gate sheet resistance.

Figure 6C:
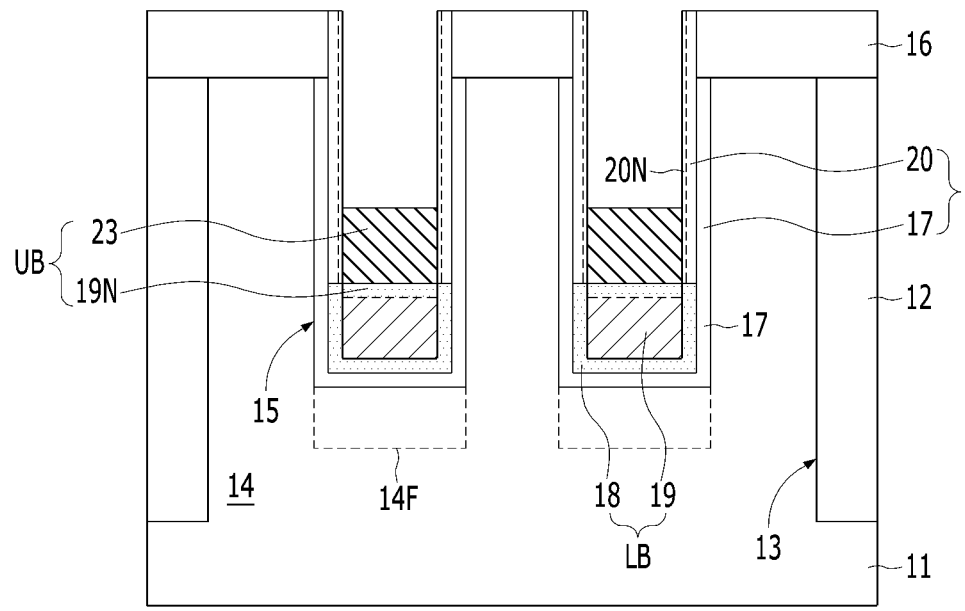

As illustrated in FIG. 6C, a second gate electrode 23 may be formed in each trench 15. In order to form the second gate electrode 23, a recessing process may be performed. The recessing process may be performed by a dry etch process, for example, an etch-back process. The second gate electrode 23 may be formed by performing the etch-back process on the second conductive layer 23A. In some embodiments, a planarization process may be performed in advance to expose a hard mask layer 16, and then the etch-back process of the recessing process may be performed. The top surface of the second gate electrode 23 may be recessed at a lower level than the top surface of an active region 14.

While the etch-back process is performed on the second conductive layer 23A, the second gate dielectric layer 20 may be exposed, and the first gate dielectric layer 17 may not be exposed. As a result, the etch-back process performed on the second conductive layer 23A may prevent the first gate dielectric layer 17 from getting damaged. The second gate dielectric layer 20 may serve as a protective layer for preventing the etch damage to the first gate dielectric layer 17. A part of the second gate dielectric layer 20 may be damaged while the etch-back process is performed on the second conductive layer 23A. Nevertheless, since the first gate dielectric layer 17 remains without damage, a GIDL may be improved.

The second barrier layer 19N and the second gate electrode 23 may be referred to as an upper buried portion UB. Accordingly, a dual buried gate structure including the lower buried portion LB and the upper buried portion UB may be formed. The lower buried portion LB may include the first gate electrode 19 having low resistance, and the upper buried portion UB may include the second gate electrode 23 having a low work function. The gate resistance of the dual buried gate structure may be lowered by the first gate electrode 19, and the GIDL may be improved by the second gate electrode 23. The second barrier layer 19N may prevent inter-diffusion and interaction between the first gate electrode 19 and the second gate electrode 23. Since the second barrier layer 19N is not present on the side wall of the second gate electrode 23, the GIDL may be further improved by the second gate electrode 23.

Figure 6D:
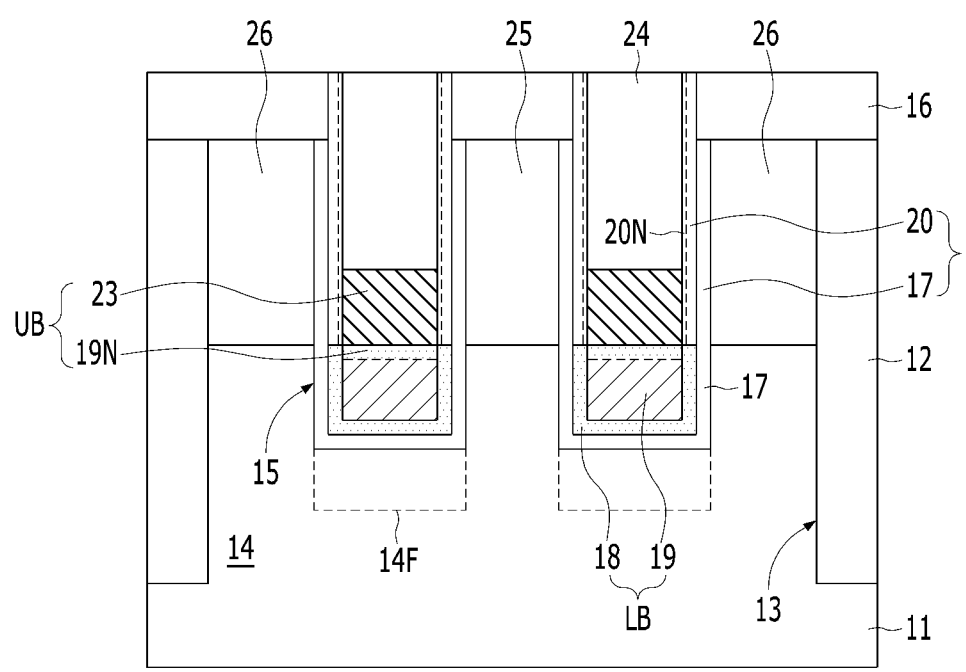

As illustrated in FIG. 6D, a capping layer 24 may be formed on the second gate electrode 23 and the second gate dielectric layer 20. The capping layer 24 includes a dielectric material. The capping layer 24 may include silicon nitride. Subsequently, the capping layer 24 may be planarized so that the top surface of the hard mask layer 16 is exposed. The capping layer 24 may have an ONO structure.

After the capping layer 24 may be formed, a doping process of an impurity is performed by implantation or other doping technique. Accordingly, a first doped region 25 and a second doped region 26 may be formed in the substrate 11.

FIGS. 7A to 7D are cross-sectional views illustrating yet another method for forming a semiconductor device. The method illustrated in FIGS. 7A to 7D may be similar to the method illustrated in FIGS. 4A to 4J.

Through the method illustrated in FIG. 4A to 4E, a second gate dielectric layer 20 covering an exposed part of a first gate dielectric layer 17 may be formed.

Figure 7A:
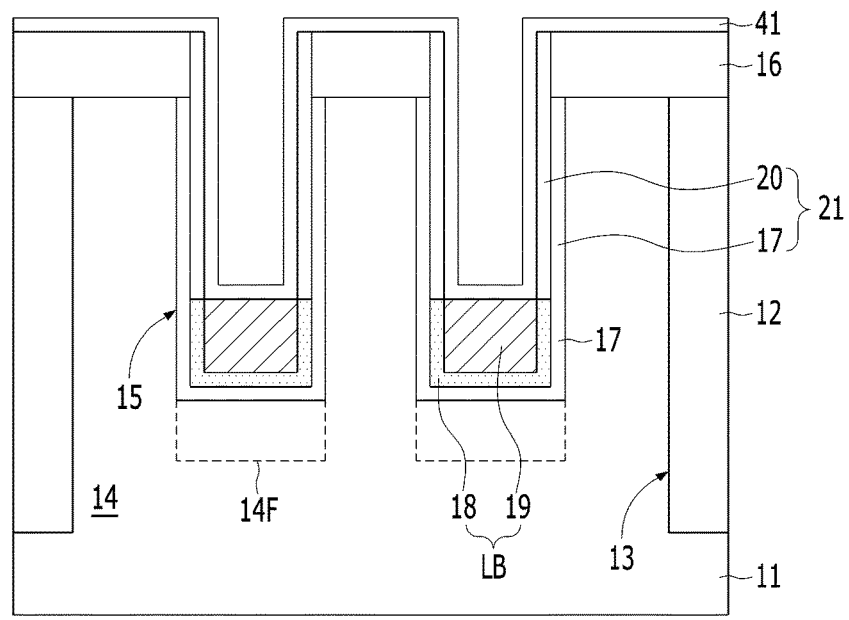
FIGS. 7A to 7D are cross-sectional views illustrating yet another method for forming a semiconductor device.

Subsequently, as illustrated in FIG. 7A, a sacrificial material 41 may be formed to cover the second gate dielectric layer 20. The sacrificial material 41 may be formed across the surface of the substrate 11 while covering the second gate dielectric layer 20 and a second barrier material 22. The sacrificial material 41 may include a dipole inducing material. The dipole inducing material may reduce a work function value of a subsequent upper buried portion.

The sacrificial material 41 may be formed by ALD or CVD.

The sacrificial material 41 may include a lanthanum atom as the dipole inducing material. The sacrificial material 41 may include a lanthanum layer, lanthanum oxide ($La_2O_3$) or a lanthanum oxide monolayer. In some embodiments, the dipole inducing material may also include yttrium, germanium, lutetium or strontium other than lanthanum. The sacrificial material 41 may include yttrium oxide ($Y_2O_3$), germanium oxide ($GeO_2$), lutetium oxide ($Lu_2O_3$) or strontium oxide (SrO). The sacrificial material 41 may be 20 Å or less thick. The sacrificial material 41 may be 1 Å to 20 Å thick.

Figure 7B:
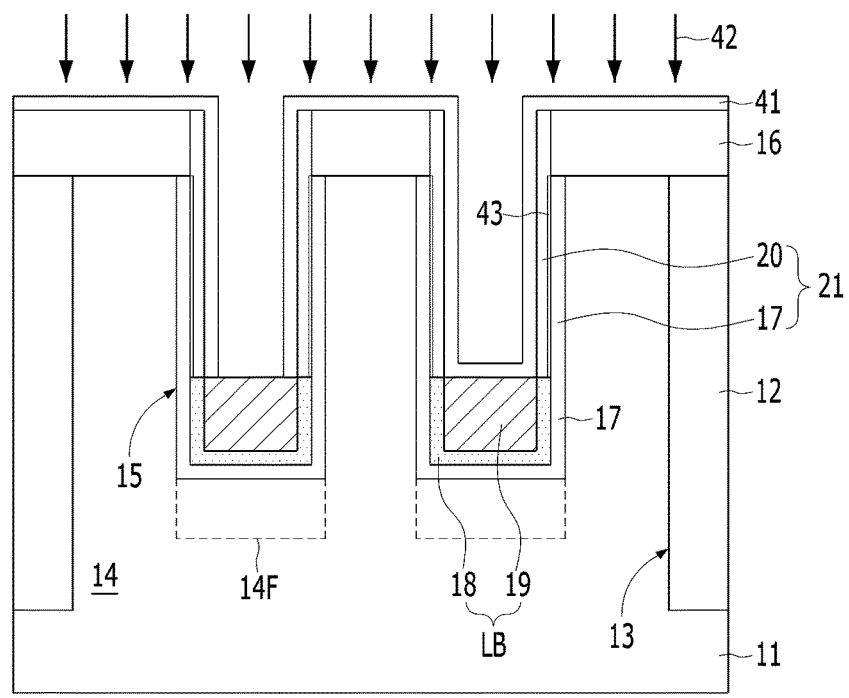

As illustrated in FIG. 7B, a thermal annealing process 42 may be formed. The thermal annealing process 42 may include a rapid thermal annealing (RTA) process. The sacrificial material 41 may be exposed to the thermal annealing process 42. When the thermal annealing process 42 is performed, the dipole inducing material may be diffused from the sacrificial material 41. The diffused dipole inducing material may be locally located in the second gate dielectric layer 20. The diffused dipole inducing material may be located at the interface between the first gate dielectric layer 17 and the second gate dielectric layer 20. Therefore, a dipole inducing portion 43 may be locally formed in the second gate dielectric layer 20. The dipole inducing portion 43 may include a diffused dipole inducing material. For example, the dipole inducing portion 43 may include a lanthanum atom. The second gate dielectric layer 20 and the first gate dielectric layer 17 may be silicon oxide, and the dipole inducing portion 43 may be lanthanum-diffused silicon oxide. The dipole inducing portion 43 may be lanthanum silicate.

In some embodiments, the dipole inducing material may be diffused into the top surface of a first gate electrode 19 by the thermal annealing process 42.

Figure 7C:
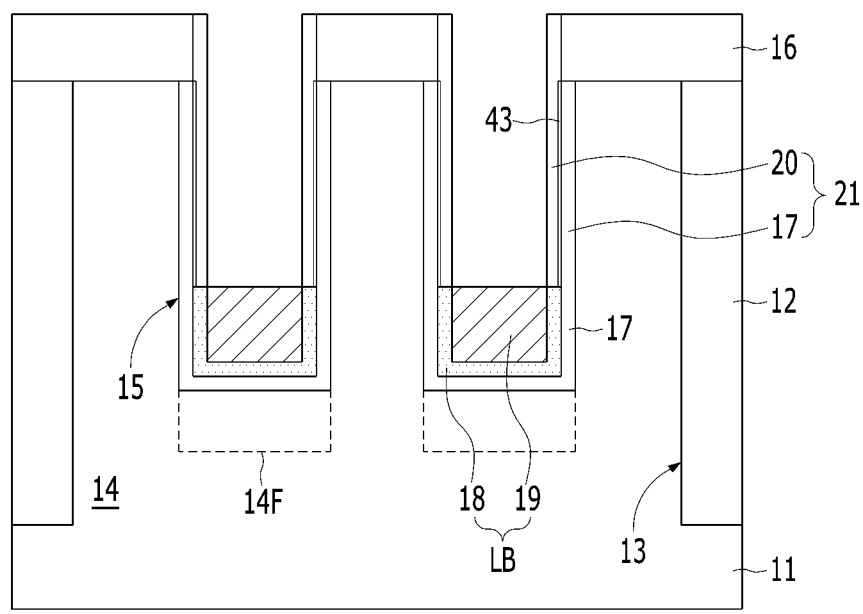

As illustrated in FIG. 7C, the sacrificial material 41 may be removed. The sacrificial material 41 may be removed, for example, by a wet etch process. By applying the wet etch process to the sacrificial material 41 as described above, the sacrificial material 41 may be selectively removed without any damage to the second gate dielectric layer 20.

Figure 7D:
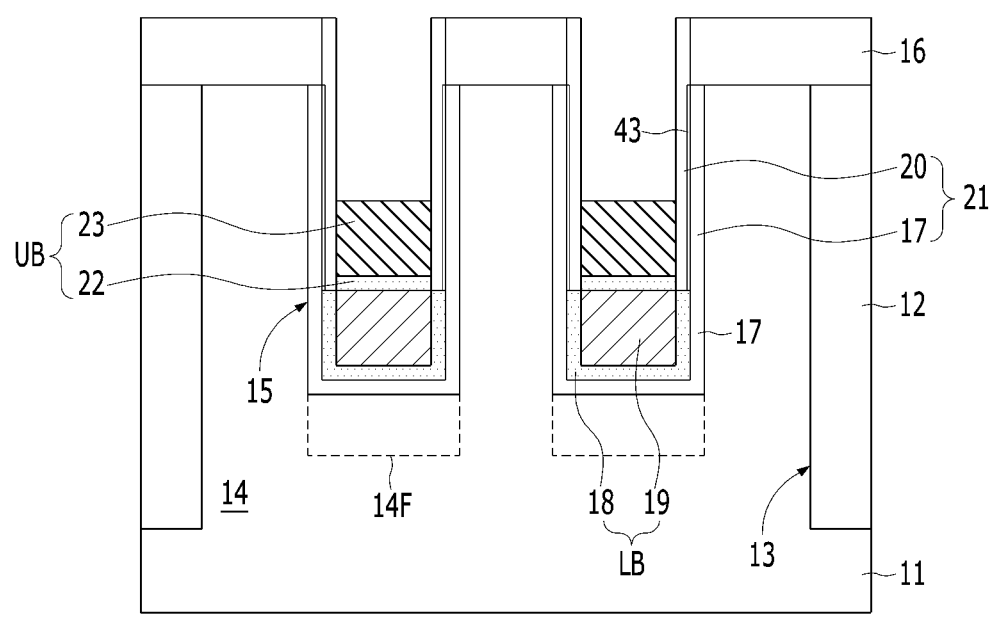

Next, a second barrier layer 22 and a second gate electrode 23 may be formed by the method illustrated in FIGS. 4F to 4I. That is, as illustrated in FIG. 7D, the second barrier layer 22 may be formed on the first gate electrode 19, and the second gate electrode 23 may be formed on the second barrier layer 22. The sidewall surface of the second gate electrode 23 may contact the second gate dielectric layer 20. The second gate dielectric layer 20 may be located between the second gate electrode 23 and the first gate dielectric layer 17, and the second gate dielectric layer 20 may include the dipole inducing portion 43.

Subsequently, a capping layer 24, a first doped region 25 and a second doped region 26 may be formed by the method illustrated in FIG. 4J.

A dipole generation mechanism will be described as follows. An oxygen atom density in the dipole inducing portion 43 may be lower than oxygen atom densities of the first and second gate dielectric layers 17 and 20. Oxygen atoms of the first and second gate dielectric layers 17 and 20 are diffused into the dipole inducing portion 43 due to the difference between the oxygen atom densities. Through the diffusion of oxygen atoms, the first and second gate dielectric layers 17 and 20 are positively charged, and the dipole inducing portion 43 is negatively charged. As such, a dipole is induced at the interface between the positively-charged first and second gate dielectric layers 17 and 20 and the negatively-charged dipole inducing portion 43. When the dipole is induced, an energy band of the second gate electrode 23 is increased, and thus the second gate electrode 23 has a decreased work function. As a result, a GIDL may be suppressed as the work function of the second gate electrode 23 decreases. The dipole inducing portion 43 may not overlap a channel 27. When the dipole inducing portion 43 and the channel 27 overlap each other, it is difficult to adjust a threshold voltage due to the induction of a low work function.

FIGS. 8A to 8D are cross-sectional views illustrating yet another method for forming a semiconductor device. The method illustrated in FIGS. 8A to 8D may be similar to the method illustrated in FIGS. 4A to 4J Also, the method shown in FIGS. 8A to 8D may be similar to the method shown in FIGS. 7A to 7D.

Through the method shown in FIG. 4A to 4E, a second gate dielectric layer 20 covering an exposed part of a first gate dielectric layer 17 may be formed.

Figure 8A:
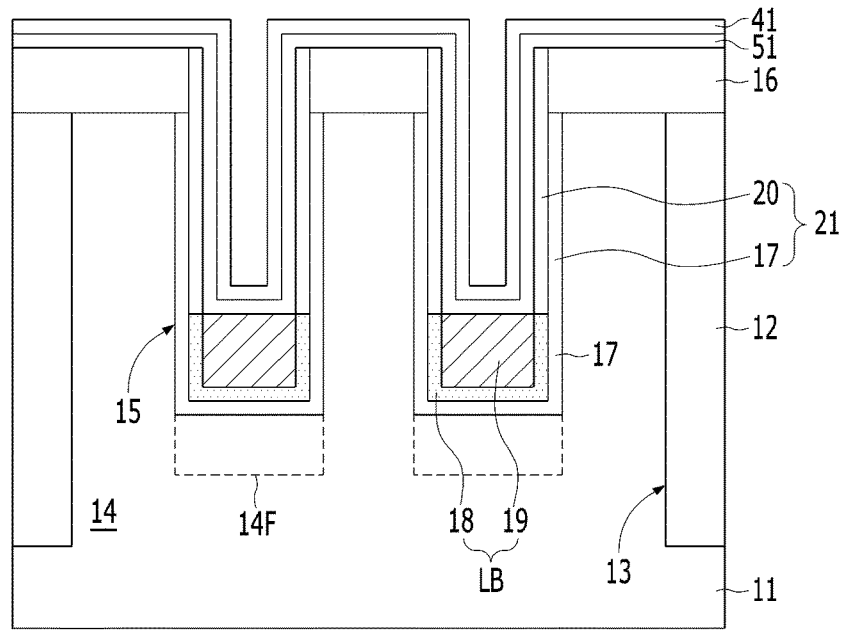
FIGS. 8A to 8D are cross-sectional views illustrating yet another method for forming a semiconductor device.

Subsequently, as illustrated in FIG. 8A, a sacrificial liner 51 and a sacrificial material 41 may be formed to cover the second gate dielectric layer 20. The sacrificial liner 51 and the sacrificial material 41 may be formed across the surface of a substrate 11 while covering the second gate dielectric layer 20 and a second barrier layer 22. The sacrificial liner 51 may include metal nitride. The sacrificial liner 51 may include titanium nitride. The sacrificial material 41 may include a dipole inducing material. The dipole inducing material may decrease a work function value of a subsequent upper buried portion.

The sacrificial liner 51 and the sacrificial material 41 may be formed by ALD or CVD. The sacrificial material 41 may include a lanthanum atom as the dipole inducing material. The sacrificial material 41 may include a lanthanum layer, lanthanum oxide ($La_2O_3$) or a lanthanum oxide monolayer. In some embodiments, the dipole inducing material may include yttrium, germanium, lutetium or strontium other than lanthanum. The sacrificial material 41 may include yttrium oxide ($Y_2O_3$), germanium oxide ($GeO_2$), lutetium oxide ($Lu_2O_3$) or strontium oxide (SrO). The sacrificial material 41 may be 20 Å or less thick. The sacrificial material 41 may be 1 Å to 20 Å thick.

Figure 8B:
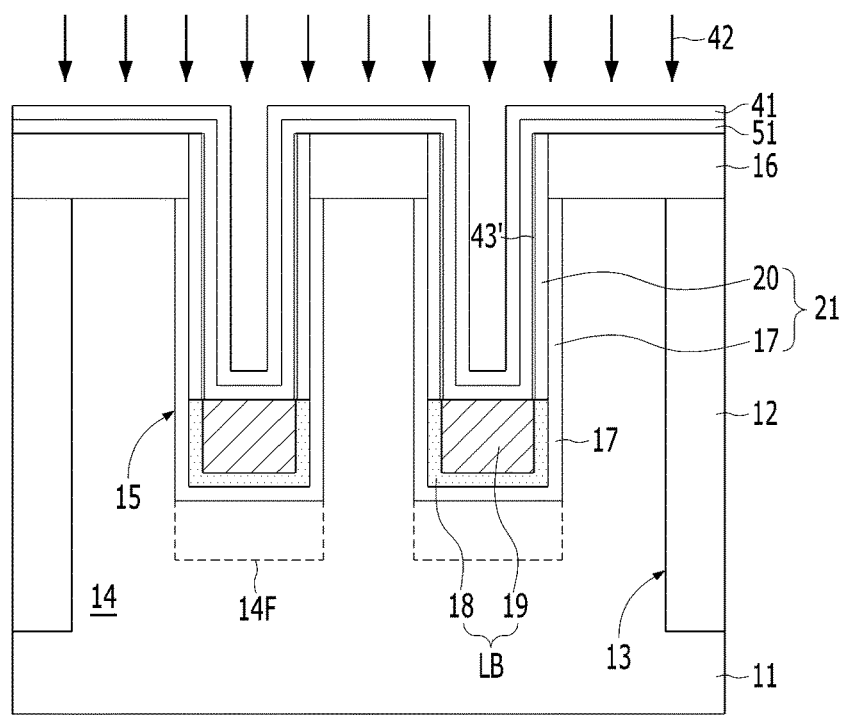

As illustrated in FIG. 8B, a thermal annealing process 42 may be formed. The thermal annealing process 42 may include a rapid thermal annealing (RTA) process. The sacrificial material 41 may be exposed to the thermal annealing process 42. When the thermal annealing process 42 is performed, the dipole inducing material may be diffused from the sacrificial material 41. The diffused dipole inducing material may be locally located in the second gate dielectric layer 20. The diffused dipole inducing material may be located at the interface between the sacrificial liner 51 and the second gate dielectric layer 20. Therefore, a dipole inducing portion 43' may be locally formed in the second gate dielectric layer 20. The dipole inducing portion 43' may include a diffused dipole inducing material. The dipole inducing portion 43' may include a lanthanum atom. The second gate dielectric layer 20 and the first gate dielectric layer 17 may be silicon oxide, and the dipole inducing portion 43' may be lanthanum-diffused silicon oxide. The dipole inducing portion 43' may be lanthanum silicate.

In some embodiments, the dipole inducing material may be diffused into the top surface of a first gate electrode 19 by the thermal annealing process 42.

Figure 8C:
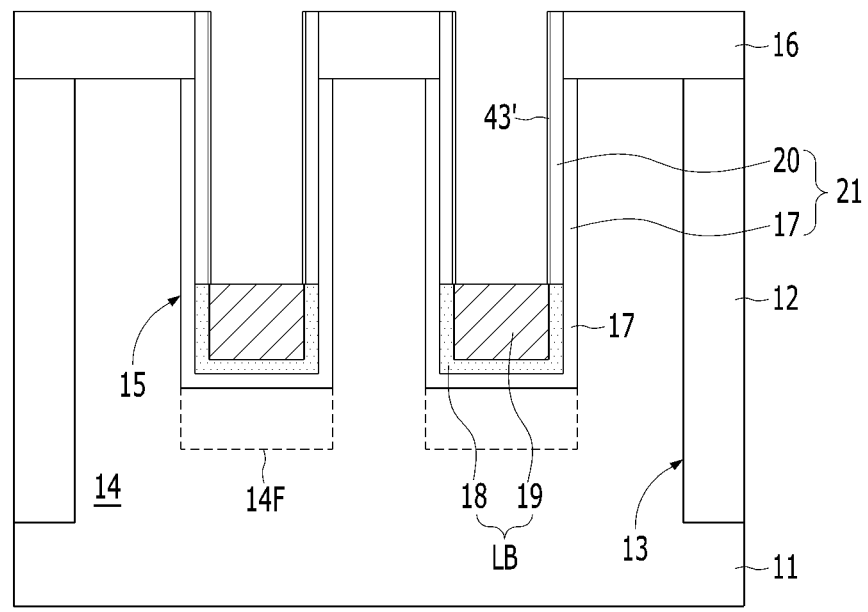

As illustrated in FIG. 8C, the sacrificial material 41 and the sacrificial liner 51 may be removed. The sacrificial material 41 and the sacrificial liner 51 may be removed, for example, by a wet etch process. By applying the wet etch process to the sacrificial material 41 and the sacrificial liner 51 as described above, the sacrificial material 41 and the sacrificial liner 51 may be selectively removed without any damage to the second gate dielectric layer 20.

Figure 8D:
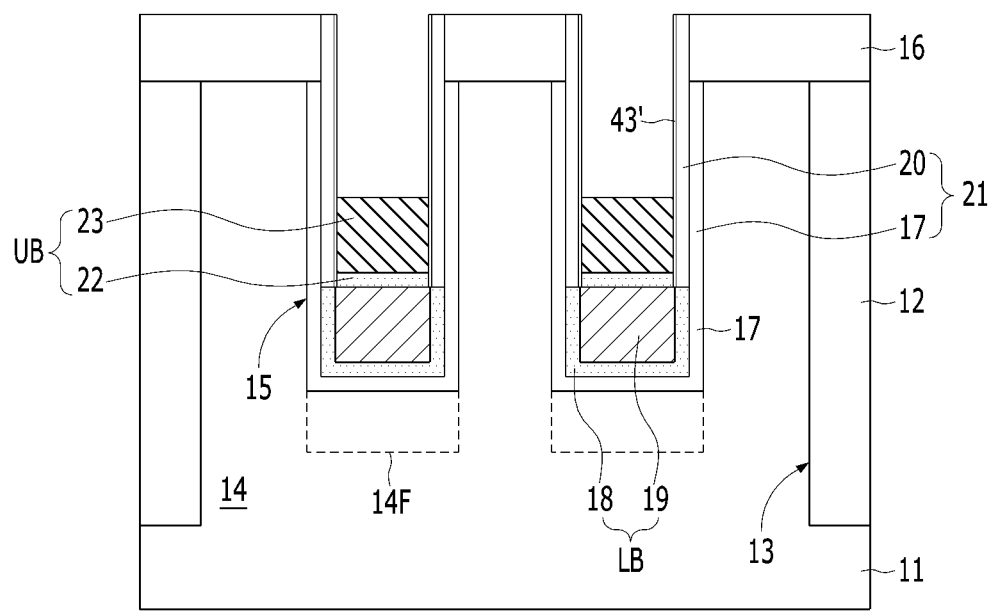

Next, a second barrier layer 22 and a second gate electrode 23 may be formed by the method illustrated in FIGS. 4F to 4I. That is, as illustrated in FIG. 8D, the second barrier layer 22 may be formed on the first gate electrode 19, and the second gate electrode 23 may be formed on the second barrier layer 22. The sidewall surface of the second gate electrode 23 may contact the second gate dielectric layer 20. The second gate dielectric layer 20 may be located between the second gate electrode 23 and the first gate dielectric layer 17, and the second gate dielectric layer 20 may include the dipole inducing portion 43'. The dipole inducing portion 43' may directly contact the sidewall surface of the second gate electrode 23.

Subsequently, a capping layer 24, a first doped region 25 and a second doped region 26 may be formed by the method illustrated in FIG. 4J.

Figure 9:
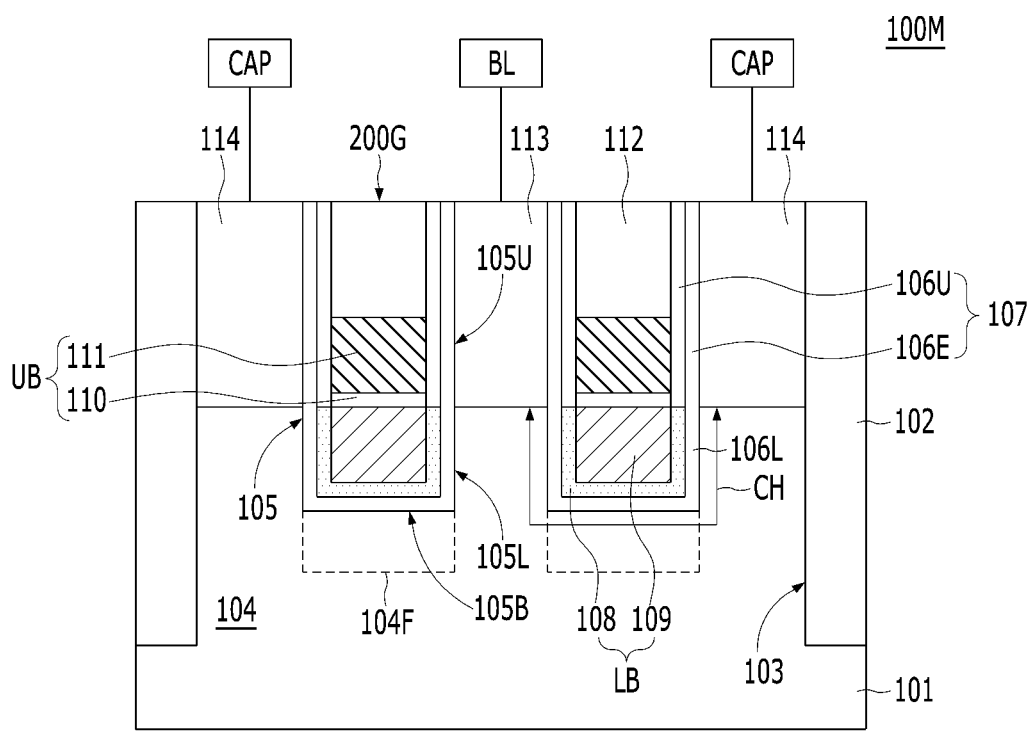
FIG. 9 is a cross-sectional view illustrating a memory cell.

FIG. 9 is a cross-sectional view illustrating a memory cell 100M.

Referring to FIG. 9, the memory cell 100M may include a cell transistor, a bit line BL and a capacitor CAP. The cell transistor may include the semiconductor device 200 of FIG. 3. Accordingly, the cell transistor may include a buried gate structure 200G, a channel region CH, a first doped region 113 and a second doped region 114. The first doped region 113 may be electrically connected to the bit line BL. The second doped region 114 may be electrically connected to the capacitor CAP.

In the memory cell 100M, the buried gate structure 200G may be referred to as a buried word line structure BWL. The buried word line structure BWL may be embedded in a trench 105. The buried word line structure BWL may include a first gate dielectric layer 106L, a second gate dielectric layer 106U, a first barrier layer 108, a first gate electrode 109, a second barrier layer 110, a second gate electrode 111 and a capping layer 112. The first gate dielectric layer 106L may include an extension portion 106E, and the extension portion 106E may contact the first and second doped regions 113 and 114. The second gate dielectric layer 106U may be formed between the second gate electrode 111 and the extension portion 106E. A dual gate dielectric structure 107 may be formed between the second gate electrode 111 and the first and second doped regions 113 and 114.

The buried word line structure BWL may be replaced with any one of the buried gate structures in accordance with the above-described embodiments, other than the buried gate structure 200G.

The capacitor CAP may include a storage node, a dielectric layer and a plate node. The storage node may have a cylindrical shape or a pillar shape. The dielectric layer may be formed on the surface of the storage node. The dielectric layer may include at least one selected from a group including zirconium oxide, aluminum oxide and hafnium oxide.

For example, the dielectric layer may have a ZAZ (ZrO$_2$/Al$_2$O$_3$/ZrO$_2$) structure where first zirconium oxide, aluminum oxide and second zirconium oxide are stacked. The plate node may be formed on the dielectric layer. The storage node and the plate node may include a metal-containing material.

The memory cell 100M may be a part of a Dynamic Random-Access Memory (DRAM) device. When the memory cell 100M is applied to the DRAM device, the refresh characteristics of the DRAM device may be improved. Also, it is possible to prevent off-leakage, which leads to improved retention time.

According to various embodiments of the present invention, a semiconductor device having a dual gate dielectric structure may be formed, thereby preventing damage of a gate dielectric layer of the dual gate dielectric structure in a subsequent process, and decreasing a GIDL.

Also, according to various embodiments of the present invention, a semiconductor memory device having a low work function gate electrode may be formed, thereby further decreasing the GIDL.

Further, according to various embodiments of the present invention, a semiconductor memory device including a dipole may be formed, thereby further decreasing the GIDL.

While the present invention has been described with respect to specific embodiments, it should be noted that the embodiments are not intended to limit the scope of the present invention. Further, it should be noted that the present invention may be achieved in various ways through substitution, change, and modification, by those skilled in the art without departing from the scope of the present invention as defined by the following claims.

What is claimed is:

1. A method for fabricating a semiconductor device comprising:
    forming a trench in a substrate;
    forming a first gate dielectric layer over the trench;
    forming a lower gate over the first gate dielectric layer;
    forming a second gate dielectric layer covering the first gate dielectric layer;
    forming an upper gate over the second gate dielectric layer and the lower gate; and
    implanting a dipole inducing material into the second gate dielectric layer before the forming of the upper gate.

2. The method of claim 1, wherein the forming of the second gate dielectric layer comprises:
    forming a dielectric material over the first gate dielectric layer and the lower gate; and
    etching the dielectric material to remain as a spacer covering the first gate dielectric layer.

3. The method of claim 1, wherein the first and second gate dielectric layers comprise the same material.

4. The method of claim 1, wherein the first and second gate dielectric layers comprise silicon oxide, silicon nitride, a high-k material or combinations thereof.

5. The method of claim 1, wherein the forming of the lower gate comprises:
    forming a first barrier material on the first gate dielectric layer;
    forming a first conductive material, filling the trench, on the first barrier material; and
    recessing the first conductive material and the first barrier material to form a first gate electrode and a first barrier layer.

6. The method of claim 1, wherein the forming of the upper gate comprises:
    selectively forming a second barrier layer on the lower gate;
    forming a second conductive material, filling the trench, on the second barrier layer; and
    recessing the second conductive material to form a second gate electrode.

7. The method of claim 6, wherein the selectively forming of the second barrier layer on the lower gate includes depositing a barrier material including a covering portion that covers a top surface of the lower gate and a dummy portion that partially covers the second gate dielectric layer,
    wherein the barrier material is non-conformally deposited so that the covering portion and the dummy portion do not contact each other.

8. The method of claim 7, wherein the selectively forming of the second barrier layer on the lower gate is performed by physical vapor deposition (PVD).

9. The method of claim 6, wherein the selectively forming of the second barrier layer on the lower gate comprises selectively performing a plasma treatment on a top surface of the lower gate.

10. The method of claim 9, wherein the plasma treatment comprises plasma nitridation.

11. The method of claim 1, wherein the implanting of the dipole inducing material into the second gate dielectric layer comprises:
    forming a sacrificial material including the dipole inducing material to cover the second gate dielectric layer and the lower gate;
    performing an annealing process to diffuse the dipole inducing material into the second gate dielectric layer; and
    removing the sacrificial material.

12. The method of claim 11, further comprising forming a sacrificial liner to cover the second gate dielectric layer and the lower gate before the forming of the sacrificial material.

13. The method of claim 12, wherein the sacrificial liner comprises metal nitride.

14. The method of claim 1, wherein the dipole inducing material is located at an interface between the upper gate and the second gate dielectric layer.

15. The method of claim 1, wherein the dipole inducing material is located at an interface between the second gate dielectric layer and the first gate dielectric layer.

16. The method of claim 1, wherein the dipole inducing material comprises a material that decreases a work function value of the upper gate.

17. The method of claim 1, wherein the dipole inducing material comprises lanthanum.

18. The method of claim 1, wherein each of the first and second gate dielectric layers comprises silicon oxide, and the dipole inducing material comprises lanthanum-containing silicon oxide.

* * * * *